(12) United States Patent
Schell et al.

(10) Patent No.: US 8,685,291 B2
(45) Date of Patent: Apr. 1, 2014

(54) VARIABLE RESISTANCE MATERIALS WITH SUPERIOR DATA RETENTION CHARACTERISTICS

(75) Inventors: Carl Schell, Waterford, MI (US); Wolodymyr Czubatyj, Warren, MI (US)

(73) Assignee: Ovonyx, Inc., Sterling Heights, MI (US)

( * ) Notice: Subject to any disclaimer, the term of this patent is extended or adjusted under 35 U.S.C. 154(b) by 643 days.

(21) Appl. No.: 12/775,078

(22) Filed: May 6, 2010

(65) Prior Publication Data

US 2011/0084240 A1 Apr. 14, 2011

Related U.S. Application Data

(60) Provisional application No. 61/251,245, filed on Oct. 13, 2009.

(51) Int. Cl.
*H01B 1/02* (2006.01)
*H01B 1/06* (2006.01)
*H01L 21/06* (2006.01)

(52) U.S. Cl.
USPC .............................. 252/519.4; 257/42; 438/95

(58) Field of Classification Search
USPC ......... 252/512–514, 519.4; 428/64.5; 438/95, 438/102; 257/42; 365/163, 113
See application file for complete search history.

(56) References Cited

U.S. PATENT DOCUMENTS

| | | | | |
|---|---|---|---|---|
| 5,825,046 A | * | 10/1998 | Czubatyj et al. | 257/2 |
| 6,087,674 A | * | 7/2000 | Ovshinsky et al. | 257/2 |
| 2010/0027328 A1 | * | 2/2010 | Czubatyj et al. | 365/163 |

* cited by examiner

*Primary Examiner* — Mark Kopec
(74) *Attorney, Agent, or Firm* — Kevin L. Bray

(57) ABSTRACT

Variable resistance memory compositions and devices exhibiting superior data retention characteristics at elevated temperature. The compositions are composite materials that include a variable resistance component and an inert component. The variable resistance component may include a phase-change material and the inert component may include a dielectric material. The phase-change material may include Ge, Sb, and Te, where the atomic concentration of Sb is between 3% and 16% and/or the Sb/Ge ratio is between 0.07 and 0.68 and/or the Ge/Te ratio is between 0.6 and 1.1 and/or the concentration of dielectric component (expressed as the sum of the atomic concentrations of the constituent elements thereof) is between 5% and 50%. The compositions exhibit high ten-year data retention temperatures and long data retention times at elevated temperatures.

41 Claims, 8 Drawing Sheets

VARIABLE RESISTANCE MATERIALS WITH SUPERIOR DATA RETENTION CHARACTERISTICS

RELATED APPLICATION INFORMATION

This application claims priority from U.S. Provisional Patent Application Ser. No. 61/251,245, filed on Oct. 13, 2009, and entitled "Variable Resistance Materials with Superior Data Retention Characteristics", the disclosure of which is incorporated by reference herein.

FIELD OF INVENTION

This invention relates to variable resistance materials and devices exhibiting improved data retention characteristics. More particularly, this invention relates to phase-change materials and devices having high thermal stability. Most particularly, this invention relates to phase-change materials and devices exhibiting greater stability against thermally-induced crystallization. The invention also provides methods of programming that facilitate improved retention of data at high temperatures.

BACKGROUND OF THE INVENTION

Variable resistance materials are promising active materials for next-generation electronic storage and computing devices. A variable resistance material is a material that possesses two or more states that differ in electrical resistance. The material can be programmed back and forth between the states by providing energy to induce an internal chemical, electronic, or physical transformation of the material that manifests itself as a change in resistance of the material. The different resistance states are distinguishable and can be used as memory states to store or process data. Variable resistance materials offer the benefit of non-volatile performance.

Phase change materials are a promising class of variable resistance materials. A phase change material is a material that is capable of undergoing a transformation, preferably reversible, between two or more distinct structural states. The distinct structural states may be distinguished on the basis of, for example, crystal structure, atomic arrangement, order or disorder, fractional crystallinity, relative proportions of two or more different structural states, or a physical (e.g. electrical, optical, magnetic, mechanical) or chemical property. In a common embodiment, the two or more distinct structural states include differing proportions of crystalline phase regions and amorphous phase regions of the phase change material, where the phase-change material is reversibly transformable between the different states. In the crystalline state, the phase change material has lower resistivity; while in the amorphous state, it has higher resistivity. Continuous variations in resistivity over a wide range can be achieved through control of the relative proportions of crystalline phase regions and amorphous phase regions in a volume of phase-change material. Reversibility of the transformations between structural states permits reuse of the material over multiple cycles of operation.

Typically, a programmable resistance device is fabricated by placing the active variable resistance material, such as a phase change material, between two electrodes. Operation of the device is effected by providing an electrical signal between the two electrodes and across the active material. In a common application, phase-change materials may be used as the active material of a memory device, where distinct data values are associated with the different structural states and each data value corresponds to a distinct resistance of the phase-change material. The different structural states employed in memory operation may also be referred to herein as memory states or resistance states of the phase-change material. Write operations in a phase-change memory device, which may also be referred to herein as programming operations, apply electric pulses to the phase-change material to alter its structural state to a state having the resistance associated with the intended data value. Read operations are performed by providing current or voltage signals across the two electrodes to measure the resistance. The energy of the read signal is sufficiently low to prevent disturbance of the structural state of the phase-change material.

Phase-change memory devices are normally operated in binary mode. In binary mode, the memory is operated between two structural states. To improve read margin and minimize read error, the two structural states for binary operation are selected to provide a large resistance contrast. The range of resistance values of a phase-change material is bounded by a set state having a set resistance and a reset state having a reset resistance. The set state is a low resistance structural state whose electrical properties are primarily controlled by the crystalline portion of the phase-change material and the reset state is a high resistance structural state whose electrical properties are primarily controlled by the amorphous portion of the phase-change material. In addition to the resistance of the phase-change material proper, the measured resistances of the set and reset states of the device also include series resistances associated with the surrounding electrodes and elements. The set state and reset state are most commonly employed in binary operation and may be associated with the conventional binary "0" and "1" states.

In order to expand the commercial opportunities for phase-change memory, it is desirable to identify new phase-change compositions, device structures, and methods of programming that lead to improved performance. Many applications require memory that is stable at elevated temperatures. In the automotive field, for example, there is a need for memory that can perform in the high temperature environment at or near an engine. A current automotive design standard (AEC—Q100-005) calls for stable memory performance at a temperature of 150° C. for 1000 hours.

High thermal stability is also desirable in processes used in the manufacture of memory or components that include memory. In these processes, the memory material may be formed and/or programmed in a particular state and it is desirable to retain that state, without incurring the inconvenience of reprogramming, throughout backend processing or product integration that may require high temperature steps. As one example, a wafer containing memory is initially fabricated, probed and packaged, and the packaged parts subsequently need to be mounted on a printed circuit board. In a typical process, mounting is accomplished with a high temperature solder reflow process. Current solder reflow processes emphasize green lead-free solders that require exposing packaged parts to temperatures above 250° C. for ~15 seconds.

Thermal stability is also important in archival memory applications. In these applications, information is stored in memory and is expected to be available for an extended period of time. Because of their non-volatility, phase-change materials are particular desirable for archival storage applications because memory states remain programmed without drawing power. In order to function effectively in archival applications, it is desirable for a memory material to retain its information for periods of several years or more at the extremes of climatic temperatures. If a memory material, for example, can store and retain data stably at temperatures of 50° C. (or higher to provide a margin of safety) for 10 years, it can provide archival storage without the need for air conditioning.

The thermal stability of phase-change materials is ultimately controlled by the tendency of the crystalline, amorphous, and mixed crystalline-amorphous structural states used as memory states to undergo thermal transformations. The extent to which memory states resist thermally-induced structural transformations at elevated temperature governs the suitability of phase-change memory for high temperature applications. Thermally-induced transformations of the relative proportions of amorphous and crystalline phases associated with a particular memory state have the effect of erasing or altering the memory state. As a result, the information initially programmed into a phase-change memory device is lost and the memory fails.

The data retention characteristics of prior art phase-change memory materials are inadequate to meet the needs of many high temperature applications. Known phase-change compositions are subject to rapid thermally-induced structural transformations when exposed to temperatures above 150° C. There is a need in the art for phase-change compositions that exhibit greater thermal stability.

SUMMARY OF THE INVENTION

This invention provides composite non-volatile memory materials and devices suitable for high temperature applications. The composite material includes a first component comprising a variable resistance material and a second component comprising an inactive material. The variable resistance component is programmable between states varying in resistance to provide memory functionality, while the inactive component is not. The structure of the inactive component remains generally stable at the programming conditions of the variable resistance component. In one embodiment, the composite composition includes discrete regions of the variable resistance material and discrete regions of the inactive component. In one embodiment, discrete regions of the inactive component are intermixed with, or dispersed between, discrete regions of the variable resistance material.

In one embodiment, the concentration of the inactive component (expressed as the sum of the atomic concentrations of the constituent elements thereof) in the composite material is between 5% and 50%. In another embodiment, the concentration of inactive component (expressed as the sum of the atomic concentrations of the constituent elements thereof) in the composite material is between 9% and 35%. In still another embodiment, the concentration of inactive component (expressed as the sum of the atomic concentrations of the constituent elements thereof) in the composite material is between 13% and 30%. In a further embodiment, the concentration of inactive component (expressed as the sum of the atomic concentrations of the constituent elements thereof) in the composite material is between 18% and 25%.

In one embodiment, the variable resistance component comprises a phase-change material. The phase-change material may include one or more of Ge, Sb, and Te. In one embodiment, atomic concentration of Sb is between 3% and 16%. In another embodiment, the atomic concentration of Sb is between 5% and 15%. In still another embodiment, the atomic concentration of Sb is between 6.5% and 12%. In a further embodiment, the atomic concentration of Sb is between 5% and 9%. In an additional embodiment, the atomic concentration of Sb is between 13% and 16%.

In one embodiment, the Sb/Ge ratio is between 0.07 and 0.68. In another embodiment, the Sb/Ge ratio is between 0.14 and 0.58. In still another embodiment, the Sb/Ge ratio is between 0.16 and 0.48. In a further embodiment, the Sb/Ge ratio is between 0.22 and 0.48. In yet another embodiment, the Sb/Ge ratio is between 0.16 and 0.28. In an additional embodiment, the Sb/Ge ratio is between 0.43 and 0.53. In one embodiment, the Ge/Te ratio is between 0.6 and 1.1. In another embodiment, the Ge/Te ratio is between 0.75 and 1.0. In still another embodiment, the Ge/Te ratio is between 0.8 and 0.95.

In one embodiment, the composite material includes a phase-change component comprising Sb and a dielectric component comprising Si. In one embodiment, the atomic concentration of Sb is between 3% and 16% and the atomic concentration of Si is between 2% and 15%. In another embodiment, the atomic concentration of Sb is between 5% and 15% and the atomic concentration of Si is between 3% and 10%. In another embodiment, the atomic concentration of Sb is between 5% and 9% and the atomic concentration of Si is between 5% and 8%. In another embodiment, the atomic concentration of Sb is between 13% and 16% and the atomic concentration of Si is between 5% and 8%. In addition to Sb, the phase-change component may further include Ge. In one embodiment, the atomic concentration of Ge is between 23% and 45%. In another embodiment, the atomic concentration of Ge is between 30% and 40%. In addition to Si, the dielectric component may include O or N. In one embodiment, the O/Si ratio is between 1.0 and 3.0. In another embodiment, the O/Si ratio is between 1.5 and 2.5. In still another embodiment, the N/Si ratio is between 1.0 and 2.0. In a further embodiment, the N/Si ratio is between 1.1 and 1.5.

The inactive component comprises a material that is electrically inactive at the conditions used to program the phase-change component and is preferably chemically unreactive toward the phase-change component. The inactive component is typically an oxide or nitride of a metal or semiconducting element. In one embodiment, the inactive component comprises a dielectric material. Representative materials for the inactive component include an oxide of silicon or germanium (e.g. $SiO_2$, $SiO_x$, $GeO_2$, or $GeO_x$), a nitride of silicon or germanium (e.g. $Si_3N_4$, $SiN_x$, or $GeN_x$), an oxynitride of silicon, $Al_2O_3$, AlN, $TaO_2$, $TeO_2$, an oxide of a transition metal, or a nitride of a transition metal. In one embodiment, the inactive material has a higher melting temperature than the variable resistance material.

The composite material may include a phase-change component and a dielectric component, where the phase-change component comprises a material that crystallizes preferentially by a growth-dominated process. The composite may include a phase-change component and a dielectric component, where the phase-change component comprises a material that primarily crystallizes from an amorphous phase to a crystalline phase having a hexagonal close-packed structure. In one embodiment, crystallization of the phase-change component occurs without proceeding through a metastable crystalline phase. In another embodiment, crystallization of the phase-change component occurs without proceeding through a face-centered cubic phase.

DETAILED DESCRIPTION OF THE ILLUSTRATED EMBODIMENTS

Figure 1A:
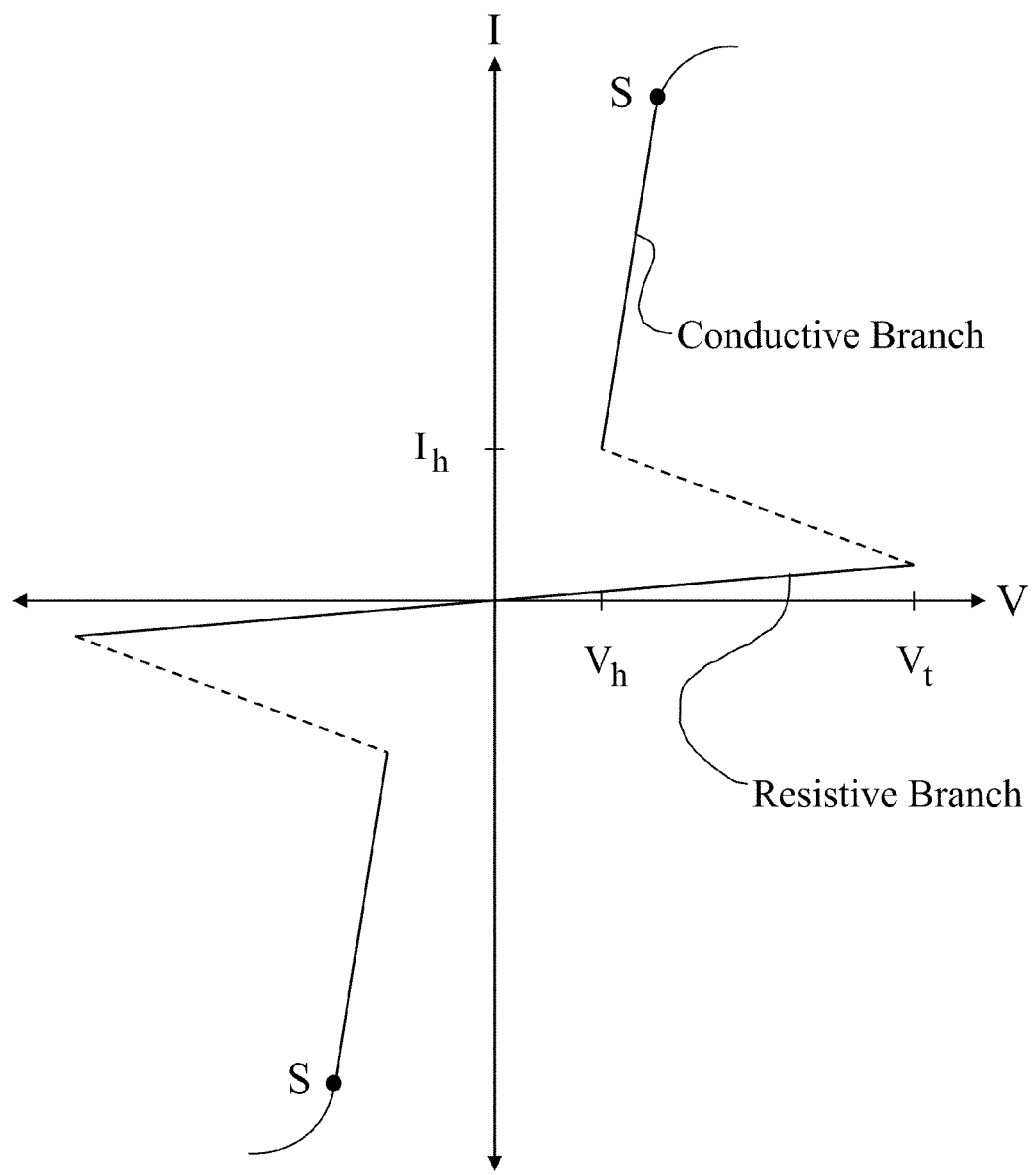
FIG. 1A is a depiction of the I-V characteristics of a chalcogenide material in an initial reset state.

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims. The compositional ranges disclosed herein are inclusive of both endpoints associated with the range.

The instant invention provides non-volatile memory materials and devices that exhibit high thermal stability. The high thermal stability includes the ability of the instant memory materials and devices to retain stored information at elevated temperatures. The increased thermal stability inhibits thermal degradation of the data retention and operational characteristics of the memory materials and devices. The instant invention further provides methods of programming non-volatile memory devices that establish programming states that are stable at elevated temperatures. The stabilized programming states are resistant to thermal degradation and maintain data integrity to higher temperatures.

The instant non-volatile memory materials are generally composite materials that include a variable resistance component and an inactive component. The variable resistance component performs as an active non-volatile memory material and in one embodiment, includes a phase-change material. The inactive component does not itself store information, but rather is used to influence the data storage and operational characteristics of the variable resistance component. In one embodiment, the inactive component includes a dielectric material.

In order to appreciate the benefits of the instant invention, it is helpful to review the basic operational characteristics of representative variable resistance materials and devices to appreciate the potential influence of temperature on performance. The following discussion focuses on chalcogenide phase-change materials as illustrative variable resistance materials. The basic principles apply equally to other forms of phase-change, state-change or variable resistance materials, such as pnictides, memristor materials, resistive random access memory (RRAM or ReRAM) materials, programmable metallization materials, polymer memory materials, metal nanoparticle memory materials, or other classes of materials transformable between two or more states distinguishable on the basis of structure, physical property or chemical property.

An important feature of the chalcogenide materials in the operation of chalcogenide-based phase-change memory devices and arrays is their ability to undergo a phase transformation between or among two or more structural states. The chalcogenide materials have structural states that may include a crystalline state, one or more partially-crystalline states and an amorphous state. The crystalline state may be a single crystalline state or a polycrystalline state. A partially-crystalline state refers to a structural state in which a volume of chalcogenide or phase-change material includes an amorphous portion and a crystalline portion. A partially-crystalline state may also be referred to herein as a mixed crystalline-amorphous state. Generally, a plurality of partially-crystalline states exists for the chalcogenide or phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the fractional crystallinities of the partially-crystalline states may vary continuously between 0% (the amorphous limit) and 100% (the crystalline limit). Phase-change chalcogenide materials are thus able to transform among a plurality of structural states that vary inclusively between fractional crystallinities of 0% and 100%.

Transformations among the structural states are induced by providing energy to the chalcogenide material. Energy in various forms can induce structural transformations of the crystalline and amorphous portions and thus can influence the fractional crystallinity of a chalcogenide material. Suitable forms of energy include one or more of electrical energy, thermal energy, optical energy or other forms of energy (e.g. particle-beam energy) that induce electrical, thermal or optical effects in a chalcogenide material. Continuous and reversible variability of the fractional crystallinity is achievable by controlling the energy environment of a chalcogenide material. A crystalline state can be transformed to a partially-crystalline or an amorphous state, a partially-crystalline state can be transformed to a crystalline, amorphous or different partially-crystalline state, and an amorphous state can be transformed to a partially-crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline or higher fractional crystallinity phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially-crystalline state in many chalcogenide materials is lower than the free energy of an amorphous state so that the overall energy of a chalcogenide material decreases as the fractional crystallinity increases. Formation (nucleation and growth) of a crystalline state or crystalline domains within a partially-crystalline or amorphous state is kinetically enabled up to the melting temperature, so that heating promotes crystallization by providing energy that facilitates the rearrangements of atoms needed to form crystalline phases or domains.

The fractional crystallinity of a partially-crystalline state can be controlled by controlling the temperature or time of heating of the partially-crystalline state or by controlling the temperature or rate of cooling of an amorphous or partially-crystalline state. Through proper control of the peak temperature, time of heating and rate of cooling, structural states over the full range of fractional crystallinity can be achieved for the chalcogenide phase-change materials.

The use of electrical energy to induce structural transformations relies on the application of electrical (current or voltage) pulses to a chalcogenide material. The mechanism of electrically-induced structural transformations includes Joule heating created by resistance to current flow. Joule heating corresponds to a conversion of electrical energy to thermal energy and leads to an increase in the temperature of the chalcogenide material. By controlling the current density, the temperature can be controlled.

The crystalline phase portions of a chalcogenide material are sufficiently conductive to permit current densities that provide efficient Joule heating. The amorphous phase portions, however, are much less conductive and ordinarily would not support current densities sufficient to heat the material to the crystallization temperature. As described more fully hereinbelow, however, the amorphous phase of many chalcogenide materials can be electrically switched to a highly conductive intermediate (dynamic) state upon application of a voltage greater than the threshold voltage. In the intermediate state, the material can support a current density that is high enough to heat the material to the crystallization temperature through Joule heating. By controlling the magnitude and/or duration of electrical pulses applied to a chalcogenide phase-change material, it is possible to continuously vary the fractional crystallinity through controlled interconversion of the crystalline and amorphous phases.

The influence of electrical energy on a chalcogenide material is generally depicted in terms of the I-V (current-voltage) and R-I (resistance-current) relationships of the material. The I-V relationship shows the current response of a chalcogenide material as a function of applied voltage and the R-I relationship shows the variation of the electrical resistance of a chalcogenide material as a result of applying electrical energy or as a function of the magnitude of the current or voltage pulse applied to a chalcogenide material. The resistance plotted on the R-I plot is the resistance measured at a fixed time (t0) after the application of the current pulse (I) and is measured at a sufficiently low voltage as to not disturb the memory state. A brief discussion of the I-V and R-I characteristics of chalcogenide materials follows.

The I-V response of many chalcogenide materials exhibits an electrical switching event in which the chalcogenide material undergoes a transformation from a more resistive state to a more conductive state. When present, an electrical switching event is generally observed only in amorphous phase chalcogenide materials or mixed crystalline-amorphous phase chalcogenide materials and is ordinarily not observed in crystalline phase chalcogenide materials. As discussed more fully hereinbelow, the limiting predominantly crystalline and amorphous phase structural states of a chalcogenide phase-change material are normally referred to as the "set" and "reset" states, respectively. FIG. 1A and the following discussion of electrical switching is an illustrative example that presupposes that the chalcogenide material is initially in the reset state.

A schematic depiction of the electrical switching event of a representative chalcogenide material in the reset state is presented in FIG. 1A. The depiction of FIG. 1A corresponds to a two-terminal device configuration in which two spacedly disposed electrodes are in contact with a chalcogenide material and the current I corresponds to the current passing between the two electrodes. The I-V curve of FIG. 1A shows the current passing through the chalcogenide material as a function of the voltage applied across the material by the electrodes. The I-V characteristics of the material are often symmetric or nearly symmetric with respect to the polarity of the applied voltage as shown in FIG. 1A. For convenience, we consider the first quadrant of the I-V plot of FIG. 1A (the portion in which current and voltage are both positive) in the discussion of chalcogenide switching behavior that follows. An analogous description that accounts for polarity applies to the third quadrant of the I-V plot.

The I-V curve includes a resistive branch and a conductive branch. The branches are labeled in FIG. 1A. The resistive branch corresponds to the regime in which the current passing through the material is a weak function of, and generally proportional to, the applied voltage across the material. This branch generally exhibits a smaller slope in the I-V plot than the conductive branch and often appears as a nearly horizontal line in the first and third quadrants of FIG. 1A. The conductive branch, also referred to as the "dynamic" or "dynamic on" state of the material or device, corresponds to the regime in which the current passing through the material is less impeded and flows more easily under the voltage applied across the material. This branch exhibits a large slope in the I-V plot and often appears as a nearly vertical line in the first and third quadrants of FIG. 1A.

The slopes of the resistive and conductive branches shown in FIG. 1A are illustrative and not intended to be limiting, the actual slopes may depend on the chemical composition or physical state of the chalcogenide material, device geometry, circuit configuration, series resistances, and electrical contacts. The slope of the resistive branch, for example, may be greater or lesser than the slope indicated in FIG. 1A and may vary depending on the relative proportions of crystalline and amorphous phase content present in the chalcogenide material. The difference between the threshold voltage and holding voltage may also be greater or lesser than indicated in FIG. 1A. Although the threshold voltage is normally greater than the holding voltage, in some devices the threshold voltage and holding voltage may be similar in magnitude. In some devices, the threshold current and holding current may also be similar in magnitude. Since the conductivity of the chalcogenide material in the conductive branch is typically higher than the conductivity of the surrounding contacts or circuitry, the slope of the conductive branch is often controlled by resistances in series with the chalcogenide material. When device conditions are such that the chalcogenide material is described by a point on the resistive branch of the I-V curve, the chalcogenide material or device may be said to be in a "resistive" state. When device conditions are such that the chalcogenide material is described by a point on the conductive branch of the I-V curve, the chalcogenide material or device may be said to be in a "conductive" state.

The switching properties of the chalcogenide material are shown in FIG. 1A. We begin with a device that has no voltage applied across it. When no voltage is applied across the chalcogenide material, the material is in a resistive state and no current flows. This condition corresponds to the origin of the I-V plot shown in FIG. 1A. The chalcogenide material remains in a resistive state as the applied voltage is increased, up to a threshold voltage (labeled $V_t$ in the first quadrant of FIG. 1A). The slope of the I-V curve for applied voltages between 0 and $V_t$ is small in magnitude and indicates that the chalcogenide material has a relatively high electrical resistance. The high resistance implies low electrical conductivity and as a result, the current flowing through the material increases only weakly as the applied voltage is increased. Since the current through the material is very low, the resistive state of the chalcogenide may be referred to as the OFF state of the material (or device). The conductive state of the chalcogenide may be referred to as the ON state of the material (or device) since the current through a device in the conductive state is high and increases significantly with increasing applied voltage.

When the applied voltage equals or exceeds the threshold voltage, the chalcogenide material transforms (switches) from the resistive branch to the conductive branch of the I-V curve. The switching event occurs essentially instantaneously and is depicted by the dashed line in FIG. 1A. Upon switching, the device voltage decreases significantly and the device current becomes much more sensitive to changes in the device voltage. The chalcogenide material remains in the conductive branch as long as a minimum current, labeled $I_h$ in FIG. 1A, is maintained. We refer to $I_h$ as the holding current and the associated voltage $V_h$ as the holding voltage of the device. If the device conditions after switching are changed so that the current becomes less than $I_h$, the material normally returns to the resistive branch of the I-V plot and requires subsequent application of a threshold voltage to resume operation on the conductive branch. If the current is only momentarily (a time less than the recovery time of the chalcogenide material) reduced below $I_h$, the conductive state of the chalcogenide material may be recovered upon restoring the current to or above $I_h$. The recovery time of chalcogenide materials has been discussed in the article "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosure of which is incorporated by reference herein.

The switching effect of the instant devices originates from a transformation of the chalcogenide material from a resistive state to a conductive state upon application of a threshold voltage, $V_{th}$. According to one model of the switching transformation, application of the threshold voltage causes the formation of a conductive channel or filament within the chalcogenide material. At the threshold voltage, the electric field experienced by the material is sufficiently high to induce a breakdown or avalanche effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide material. The conductive filament extends through the chalcogenide material between the device terminals and provides a low resistance pathway for electrical current. Portions of the chalcogenide material outside of the filament remain resistive. Since electric current traverses the path of least resistance, the presence of a conductive filament renders the chalcogenide material conductive and establishes a conductive state. The creation of a conductive filament is the event that underlies the switching of the chalcogenide material from a resistive state to a conductive state.

The conductive filament is maintained between the device terminals as long as the device current remains at or above the holding current. A conductive filament is present for all points along the conductive branch, but the cross sectional area of the filament differs for different points along the conductive branch. Depending on operating conditions within the conductive branch, the filament can be narrow or wide. As the applied voltage is increased along the conductive branch, the cross section of the filament is enlarged as the applied voltage is increased. The enlarged filament indicates that a greater volume of the chalcogenide material exhibits high conductivity. When the filament reaches the dimensions of the pore, it can no longer expand and the device resistance increases (beginning at points S in FIG. 1A). Due to the increased fractional conversion of the phase-change material to the highly conductive dynamic state through filament expansion, the chalcogenide material can support increasingly higher current in the conductive state as the applied voltage is increased. Variations of the voltage applied to a chalcogenide material operating in the conductive branch modify the width or thickness of the filament in directions lateral to the direction of current flow. The net effect of varying the applied voltage of a chalcogenide material operating in the conductive branch is to modify the volume fractions of the conductive and resistive portions. Such modifications ultimately enable control over the resistance of the phase-change material through variations in the relative proportions of crystalline and amorphous phase regions in the structural state of the chalcogenide material.

Figure 1B:
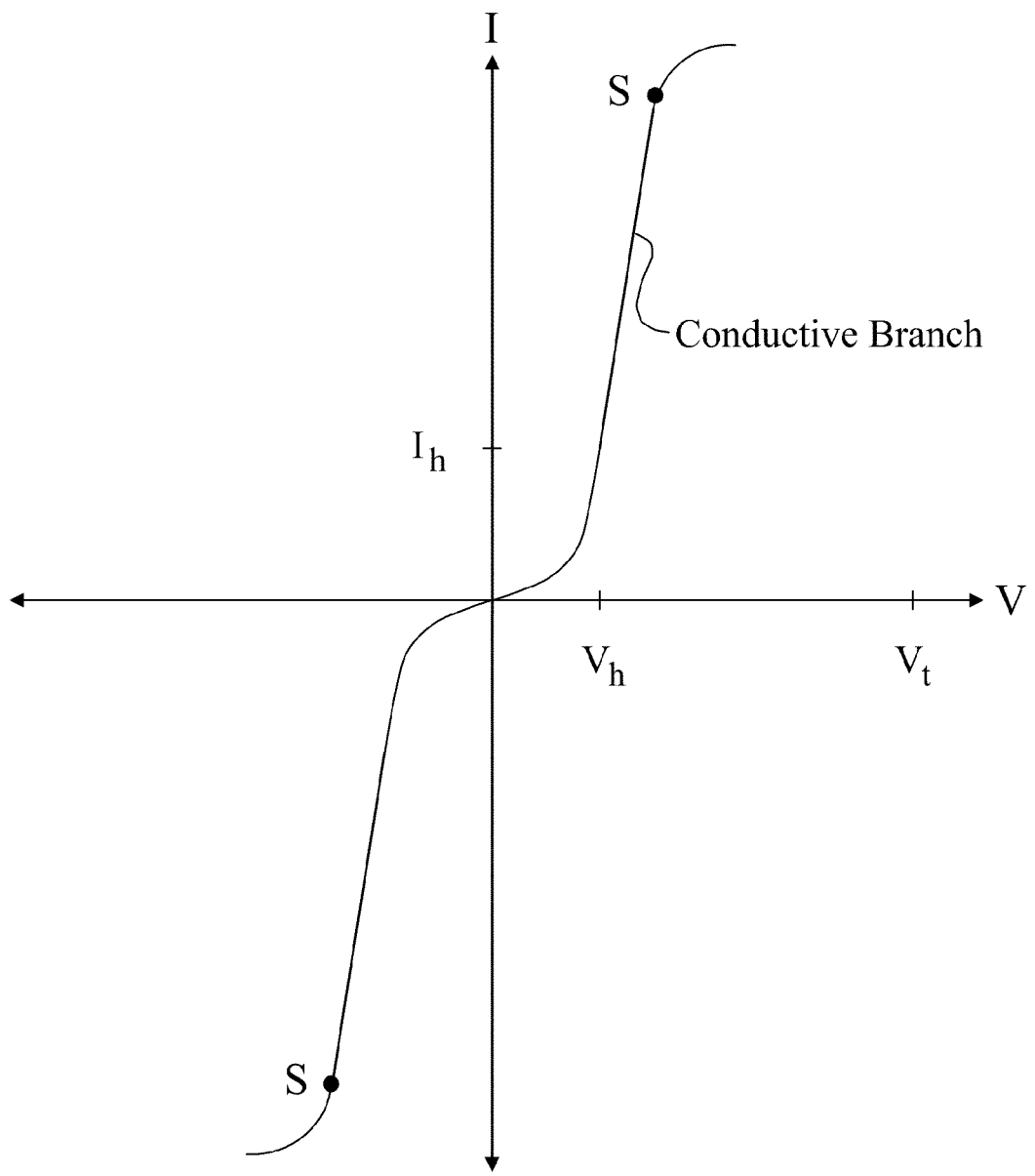
FIG. 1B is a depiction of the I-V characteristics of a chalcogenide material in an initial set state.

When the chalcogenide material is initially in the set state, the switching event shown in FIG. 1A is not observed. Instead, the I-V response exhibits a monotonic increase in current with increasing voltage (FIG. 1B). The I-V response of a material in the set state merges with the conductive branch (dynamic on state) shown in FIG. 1A for a device initially in the reset state. Mixed crystalline-amorphous states generally exhibit a switching event, but at voltages below the threshold voltage observed for the reset state. A progressive decrease in the voltage at which switching occurs is observed as the crystalline phase volume fraction increases from the reset state to the set state. The I-V characteristics of mixed crystalline-amorphous states are generally intermediate between those depicted for the reset and set states in FIGS. 1A and 1B, respectively. All of the states, however, generally share a common dynamic on state.

Chalcogenide materials of many chemical compositions undergo the foregoing switching effect. Representative chalcogenide materials are those that include one or more elements from column VI of the periodic table (the chalcogen elements) and optionally one or more chemical modifiers from columns III, IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament. Trivalent and tetravalent modifiers such as Al, Ga, In, Ge, Sn, Si, P, As and Sb enter the chain and ring structures of chalcogen elements and provide points for branching and crosslinking. The structural rigidity of chalcogenide materials depends on the extent of crosslinking and leads to a broad classification of chalcogenide materials, according to their ability to undergo crystallization or other structural rearrangements, into one of two types: threshold switching materials and phase-change (or memory) materials.

Both types of chalcogenide materials display the switching behavior shown in FIG. 1A, but differ in their structural response to filament formation. The threshold switching materials generally possess a higher concentration of modifiers and are more highly crosslinked than the phase-change materials. They are accordingly more rigid structurally. Threshold switching materials are amorphous and show little or no tendency to crystallize because the atomic rearrangements required to nucleate and grow a crystalline phase are inhibited by the rigidity of the structure. Threshold switching materials do not undergo a crystallization transformation during switching and remain amorphous upon removing the applied voltage after switching.

Phase-change chalcogenide materials, on the contrary, are lightly crosslinked and more easily undergo full or partial crystallization. An amorphous phase-change material undergoes filament formation in the presence of a threshold voltage as described in FIG. 1A hereinabove. Once in the conductive branch, however, the phase-change material may undergo nucleation and growth of a crystalline phase due to Joule heating. The volume fraction of the crystalline phase depends on the magnitude and time of the current passing through the phase-change material. If formed, the crystalline phase is retained upon removing the applied voltage after switching. Through appropriate selection of device operating conditions, the amorphous-crystalline transformation of chalcogenide phase-change memory materials becomes reversible over many cycles. Chalcogenide memory materials have been discussed in U.S. Pat. Nos. 5,166,758; 5,296,716; 5,534,711; 5,536,947; 5,596,522; and 6,087,674; the disclosures of which are hereby incorporated by reference.

Figure 2:
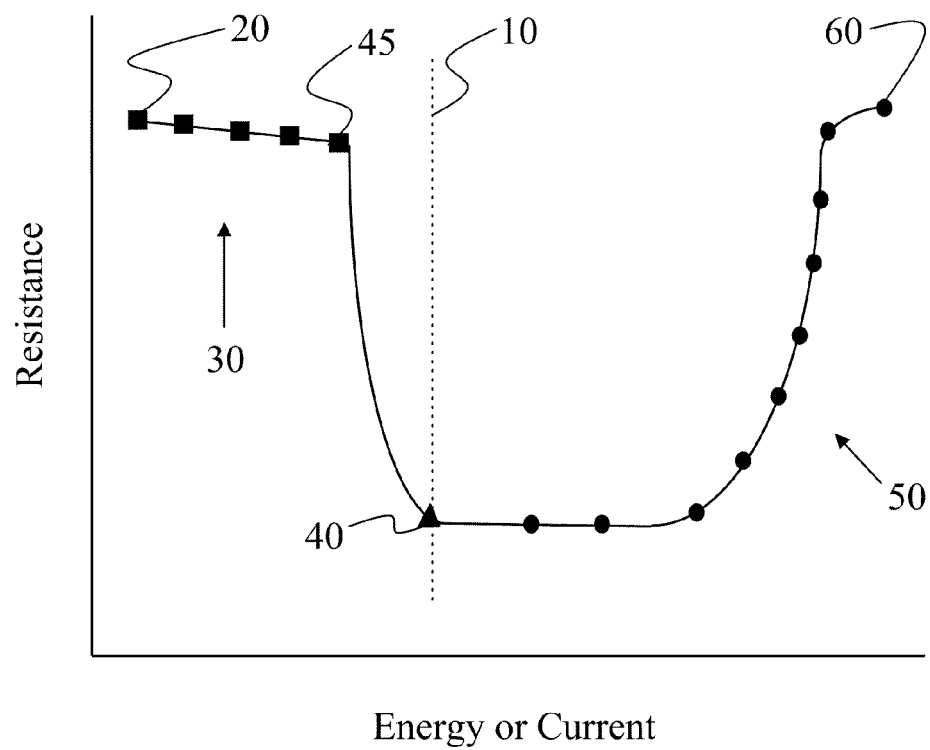
FIG. 2 is an illustrative Resistance vs. Energy/Current plot for a chalcogenide phase-change material.

The R-I response is a meaningful depiction of the characteristics of the chalcogenide phase-change memory devices and provides a representation of the effect of structural transformations associated with the crystalline-amorphous phase-change process on electrical properties. A representative depiction of the electrical resistance (R) of a chalcogenide memory device as a function of electrical energy or current pulse magnitude (Energy/Current) is presented in FIG. 2 for a device in which the chalcogenide material begins in the reset state (discussed below). FIG. 2 may generally be referred to as a resistance plot.

The resistance plot includes two characteristic response regimes of the device to electrical energy. The regimes are approximately demarcated with the vertical dashed line 10 shown in FIG. 2. The regime to the left of the line 10 may be referred to as the accumulating regime of the chalcogenide material. The accumulation regime is distinguished by a nearly constant or gradually varying electrical resistance with increasing electrical energy until a highly conducting state is reached. In most cases there is a region where device temperatures favor crystalline growth and when a percolation path forms, a pronounced resistance drop is observed for the device. The accumulation regime extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. The plateau 30 may be horizontal or sloping.

The left side of the resistance plot is referred to as the accumulating regime because the structural state of the chalcogenide material cumulatively evolves as energy is applied. The fractional crystallinity of the structural state correlates with the total accumulation of applied energy. The leftmost point 20 corresponds to the structural state in the accumulating regime having the lowest fractional crystallinity and may be referred to as the reset state. This state may be fully amorphous or may be primarily amorphous with some degree of crystalline content. As energy is added, the chalcogenide material progresses among a plurality of partially-crystalline states with increasing fractional crystallinity along the plateau 30. Selected accumulation states (structural states in the accumulation region) are marked with squares in FIG. 2.

Upon accumulation of a sufficient amount of applied energy, the fractional crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing applied energy within the plateau region 30 and are reversible only by first driving the chalcogenide material through the set point 40 and resetting (melting and quenching the device). Once the reset state is obtained, lower amplitude current pulses can be applied and the accumulation response of the chalcogenide material can be retraced. It is possible to reversibly transform between the set and reset states over multiple cycles of operation.

While not wishing to be bound by theory, it is believed that the addition of energy to a chalcogenide material in the accumulating regime leads to an increase in fractional crystallinity through the nucleation of new crystalline domains or growth of existing crystalline domains or a combination thereof. It is further believed that the electrical resistance varies only gradually along the plateau 30, despite the increase in fractional crystallinity, because the crystalline domains form or grow in relative isolation of each other so as to prevent the formation of a contiguous crystalline network that spans the chalcogenide material between the two device electrodes. This type of crystallization may be referred to as sub-percolation crystallization.

The setting transformation coincides with a percolation threshold in which a contiguous, interconnected crystalline network forms within the chalcogenide material and bridges the space between the two electrodes of the device. Such a network may form, for example, when crystalline domains increase sufficiently in size to impinge upon neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point 20 of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 2 may be referred to as the direct overwrite regime. The direct overwrite regime extends from the set state 40 through a plurality of intermediate states (generally depicted by 50) to a reset point or state 60. The various points in the direct overwrite regime may be referred to as direct overwrite states of the chalcogenide material. Selected direct overwrite states are marked with circles in FIG. 2. Structural transformations in the direct overwrite regime may be induced by applying an electric current or voltage pulse to a chalcogenide material. In FIG. 2, an electric current pulse is indicated. In the direct overwrite regime, the resistance of the chalcogenide material varies with the magnitude of the applied electric pulse. The resistance of a particular direct overwrite state is characteristic of the structural state of the chalcogenide material, and the structural state of a chalcogenide material is dictated by the magnitude of the applied current pulse. The fractional crystallinity of the chalcogenide material decreases as the magnitude of the current pulse increases. The fractional crystallinity is highest for direct overwrite states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material. As a result, the resistance of the chalcogenide material increases as the magnitude of an applied current pulse increases in the direct overwrite region.

In contrast to the accumulating region, structural transformations that occur in the direct overwrite region are reversible and bi-directional. As indicated hereinabove, each state in the direct overwrite region may be identified by its resistance and an associated current pulse magnitude, where application of the associated current pulse magnitude induces changes in fractional crystallinity that produce the particular resistance state. Application of a subsequent current pulse may increase or decrease the fractional crystallinity of an existing resistance state of the chalcogenide material. If the subsequent current pulse has a higher magnitude than the pulse used to establish the existing state, the fractional crystallinity of the chalcogenide material decreases and the structural state is transformed from the existing state in the direction of the reset state along the direct overwrite resistance curve. Similarly, if the subsequent current pulse has a lower magnitude than the pulse used to establish the existing state, the fractional crystallinity of the chalcogenide material increases and the structural state is transformed from the existing state in the direction of the set state along the direct overwrite resistance curve.

The direct overwrite states of the chalcogenide material may be used to define memory states of a memory device. Most commonly, the memory devices are binary memory devices that utilize two of the direct overwrite states as memory states, where a distinct data value (e.g. "0" or "1") is associated with each state. Each memory state thus corresponds to a distinct structural state of the chalcogenide material and readout or identification of the state can be accomplished by measuring the resistance of the material (or device) since each structural state is characterized by a distinct resistance value. The operation of transforming a chalcogenide material to the structural state associated with a particular memory state may be referred to herein as programming the chalcogenide material, writing to the chalcogenide material or storing information in the chalcogenide material.

The instant invention provides phase-change compositions whose data retention characteristics are resistant to thermal degradation. As noted hereinabove, programming of phase-change compositions involves providing energy to induce controlled transformations between a plurality of crystalline, amorphous, or mixed crystalline-amorphous states. Programming between structural states is typically based ultimately on controlled manipulation of thermal energy. With electrical programming, for example, structural transformations are effected through the Joule heating that accompanies current flow. Variations characteristics such as the amplitude, shape, duration, risetime and falltime of electrical programming pulses provides the control over the thermal environment needed to program intended states.

The inherent sensitivity of phase-change materials to temperature, however, renders them susceptible to unintended structural transformations when subjected to high temperature environments. The crystallization temperature and melting temperature of a phase-change material are two indicators of the stability of a structural (or memory) state. As noted hereinabove, if a phase-change material is exposed to a temperature of at least the crystallization temperature for a sufficient period of time, the fractional crystallinity of the phase-change material increases as a portion of the amorphous phase volume fraction is transformed to a crystalline phase. Similarly, the amorphous phase volume fraction of a phase-change material can be increased at the expense of the crystalline phase volume fraction if the phase-change material is heated to the melting temperature and cooled sufficiently rapidly.

Since the crystallization temperature is less than the melting temperature, the crystallization temperature typically limits the thermal stability of a phase-change material. Data integrity is most likely to be compromised at elevated temperature through unintended thermally-induced crystallization of the phase-change material. As noted above, the resistance of a phase-change material varies with the relative proportions of crystalline and amorphous phase regions. As a result, unintended thermally-induced crystallization compromises data integrity by transforming an initial memory state to an unintended memory state. A subsequent read of the memory leads to an error.

This invention provides material compositions and methods of programming that improve the thermal stability of the structural states of phase-change memory materials and devices. The phase-change compositions are generally chalcogenide materials that include a chalcogen element along with one or more modifying elements. The chalcogen element is most commonly Te and modifiers include column IV elements and/or column V elements. In one embodiment, the chalcogenide material includes Te along with Ge and Sb. Although Ge—Sb—Te materials such as $Ge_2Sb_2Te_5$ are known in the prior art, the instant inventors have discovered new compositions that lead to unexpectedly superior data retention characteristics at elevated temperatures. In particular, the instant compositions remain unexpectedly stable against crystallization at elevated temperatures relative to prior art compositions.

In another aspect of the invention, the non-volatile memory material is a composite material that includes a variable resistance material as one component and an inactive material as another component. In the composite material, the variable resistance component is programmable between structural states to provide memory functionality, while the inactive component is not. The structure of the inactive component remains generally stable at the conditions used to program the variable resistance component. The inactive component is generally the minority component of the composite material and the variable resistance material is generally the majority component.

Figure 3:
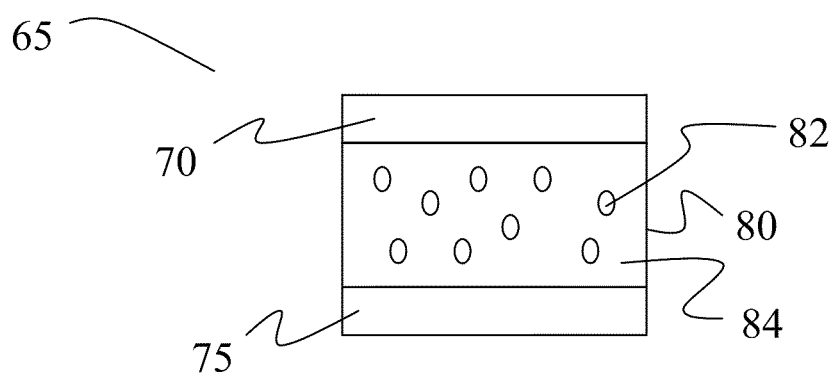
FIG. 3 depicts a composite material including a variable resistance component and an inactive component disposed between two electrodes of an electronic device.

In one embodiment, the composite material includes discrete regions of the variable resistance material and discrete regions of the inactive component. The discrete regions of the inactive component may be intermixed with, or dispersed between, discrete regions of the variable resistance material. FIG. 3 shows a schematic depiction of a device having an active region that includes a composite material according to the instant invention. Electronic device 65 that includes upper electrode 70, lower electrode 75, and active region 80. Active region 80 is occupied by a composite material that includes a variable resistance component 84 and an inactive component 82. Variable resistance component 84 is responsive to application of a voltage or current between upper electrode 70 and lower electrode 75, while inactive component 82 is not. Inactive component 82 may be distributed uniformly or non-uniformly within variable resistance component 84. The individual regions of inactive component 82 may be uniform or non-uniform in size, shape, structure and/or composition.

The variable resistance component may include a phase-change material or chalcogenide material in accordance with the instant invention, including with the atomic concentrations or ratios thereof of elements described herein. In one embodiment, the inactive component includes a dielectric material. In one embodiment, the dielectric material has a higher melting temperature than the variable resistance material. The inactive component is generally an oxide or nitride of a metal or semiconducting element. Representative materials for the inactive component include an oxide of silicon or germanium (e.g. $SiO_2$, $SiO_x$, $GeO_2$, or $GeO_x$), a nitride of silicon or germanium (e.g. $Si_3N_4$, $SiN_x$, or $GeN_x$), an oxynitride of silicon, $Al_2O_3$, AlN, $TaO_2$, $TeO_2$, an oxide of a transition metal, or a nitride of a transition metal. The inactive component is preferably electrically-inactive at the conditions used to program the phase-change component as well as chemically inert with respect to the phase-change component.

Illustrative embodiments and benefits of the instant invention are described in the following examples.

EXAMPLE 1

In this example, the device structure and representative phase-change compositions are described. The device structure was the pore structure depicted in FIG. 4. Device 100 included a silicon substrate 105 with a surface $SiO_2$ oxide layer 110. A lower electrode 115 having a thickness of 500 Å made from TiAlN was formed over the surface oxide. An insulator layer 120 ($SiO_2$) having a thickness of 500 Å was formed over lower electrode 115. A pore opening 125 was formed in insulator layer 120 and an active material 130 having a thickness of ~750 Å was formed over and within pore 125. Active material 130 was a phase-change or composite material having one of the compositions described hereinbelow. Multiple devices were fabricated with each composition. The diameter of pore opening 125 for the different devices typically ranged from ~70 nm to ~150 nm. Top electrode 135 was formed over active material 130. Top electrode 135 included a 20 Å thick layer of Ti in contact with active material 130 and a 600 Å thick layer of TiN formed over the layer of Ti. As a final step, an aluminum layer 140 having a thickness of 5000 Å was formed over top electrode 135. Layer 140 served as a probe metal pad on top of the device.

Active material 130 was formed via a sputtering process utilizing one or more sputtering targets of various compositions. Targets with the following compositions were available: Ge, GeTe, $Ge_{40}Sb_{10}Te_{50}$, $Ge_{35}Sb_9Te_{56}$, $Ge_{22}Sb_{22}Te_{56}$, $Ge_{15}Sb_{32}Te_{50}$, $Ge_{15}Sb_{43}Te_{42}$, $Ge_{10}Sb_{65}Te_{25}$, Sb, and $SiO_2$. One or more targets was selected and the relative sputtering power and/or time of deposition of each target was controlled to achieve the intended composition of the sputtered material. Specific compositions can typically be achieved from multiple combinations of one or more targets by appropriately controlling the relative sputtering power and/or time of deposition of each target. The composition $Ge_{40}Sb_{10}Te_{50}$, for example, may be formed by directly sputtering a $Ge_{40}Sb_{10}Te_{50}$ target. Alternatively, the composition $Ge_{40}Sb_{10}Te_{50}$ may be formed by co-sputtering targets of GeTe and $Ge_{15}Sb_{32}Te_{50}$ and adjusting the sputtering power of each target so that 70% (on a molar basis) of the material arriving at the deposition surface originates from the GeTe target and 30% (on a molar basis) of the material arriving at the deposition surface originates from the $Ge_{18}Sb_{32}Te_{50}$ target. In one experiment, for example, it was observed that a sputtering power ratio of about 45:24 (GeTe target: $Ge_{18}Sb_{32}Te_{50}$ target) produced the 70:30 molar ratio needed to produce a $Ge_{40}Sb_{10}Te_{50}$ composition on the deposition surface. Similar correlations were developed for other targets and other intended compositions on the deposition surface. Sb enrichment of $Ge_{40}Sb_{10}Te_{50}$ can be achieved by co-sputtering an Sb target with a $Ge_{40}Sb_{10}Te_{50}$ target or a combination of GeTe and $Ge_{15}Sb_{32}Te_{50}$ or GeTe and $Ge_{10}Sb_{65}Te_{25}$ targets (where the relative 70:30 molar ratio noted above is preserved, or nearly so).

Formation of composite materials that include an active phase-change component and an inactive component (such as a dielectric material) can be achieved by co-sputtering a target of the inactive component along with one or more targets containing Ge, Sb, and/or Te. Alternatively, a single composite target formed by combining the inactive component material (or elements thereof) and a phase-change material (or elements thereof) can be utilized. Through the choice of target compositions and sputtering conditions, single component phase-change material or multi-component composite phase-change material-inactive material compositions can be deposited over the full range of proportions of Ge, Sb, Te, and elements of an inactive material. The relative proportions of the phase-change and inactive material components of composite materials may also be continuously varied by controlling the relative sputtering powers of the one or more targets used in the deposition.

Compositions formed for the purpose of illustrating the favorable data retention characteristics described in the examples hereinbelow included:

| | Active Material Composition (At %) | | | | | |
|---|---|---|---|---|---|---|
| Sample | Ge | Sb | Te | Si | O | Method |
| 1 | 22 | 22 | 56 | | | Nominal |
| 2 | 18 | 32 | 50 | | | Nominal |
| 3 | 36 | 14 | 50 | | | Nominal |
| 4 | 41 | 11 | 48 | | | Nominal |
| 5 | 41 | 25 | 34 | | | Nominal |
| 6 | 36.4 | 5.8 | 38.7 | 6.4 | 12.7 | EDX |
| 7 | 39.1 | 5.6 | 42.0 | 4.5 | 8.9 | EDX |
| 8 | 45.9 | 6.0 | 48.2 | | | EDX |
| 9 | 37.9 | 10.0 | 45.5 | 2.2 | 4.4 | EDX |
| 10 | 15.1 | 24.9 | 41.2 | 5 | 10 | EDX |
| 11 | 26.6 | 23.1 | 50.3 | | | EDX |
| 12 | 33.8 | 15.5 | 50.7 | | | EDX |
| 13 | 39.7 | 8.8 | 51.6 | | | EDX |
| 14 | 41.5 | 9.1 | 49.4 | | | WDS |
| 15 | 39.0 | 9.8 | 47.8 | 1.9 | 1.6 | WDS |
| 16 | 39.2 | 7.3 | 44.1 | 3.2 | 6.2 | WDS |
| 17 | 35.0 | 9.9 | 41.0 | 4.9 | 9.2 | WDS |
| 18 | 32.1 | 6.9 | 37.2 | 7.4 | 16.4 | WDS |

-continued

| Active Material Composition (At %) | | | | | |
|---|---|---|---|---|---|
| Sample | Ge | Sb | Te | Si | O | Method |
| 19 | 25.2 | 6.6 | 31.1 | 12.2 | 24.9 | WDS |
| 20 | 40 | 10 | 50 | | | Nominal |
| 21 | 29.1 | 8.6 | 41.2 | 6.9 | 14.1 | WDS |
| 22 | 23.9 | 7.9 | 37.2 | 10.8 | 20.2 | WDS |
| 23 | 54 | | 46 | | | EDX |
| 24 | 50.9 | | 39.6 | 2.8 | 5.7 | EDX |
| 25 | 46.5 | 0 | 35.1 | 6.1 | 12.3 | EDX |
| 26 | 40.3 | 0 | 29.8 | 9.7 | 19.4 | EDX |
| 27 | 10 | 65 | 25 | | | Nominal |
| 28 | 50 | | 50 | | | Nominal |
| 29 | 44.7 | 9.4 | 45.5 | | | WDS |
| 30 | 34.6 | 10.2 | 35.1 | 6.7 | 13.4 | WDS |
| 31 | 36.4 | 14.8 | 39.8 | 3.0 | 6.1 | Nominal |
| 32 | 30.5 | 14.5 | 33.5 | 7.2 | 14.2 | WDS |
| 33 | 32.7 | 20.7 | 37.5 | 3.0 | 6.1 | Nominal |
| 34 | 30.9 | 23.6 | 36.4 | 3.0 | 6.1 | Nominal |
| 35 | 22 | 22 | 56 | | | Nominal |
| 36 | 20.2 | 20.5 | 49.6 | 3.1 | 6.5 | WDS |
| 37 | 19.0 | 17.0 | 40.4 | 7.4 | 16.3 | WDS |
| 38 | 13.4 | 12.3 | 32.3 | 13.5 | 28.6 | WDS |
| 39 | 39.2 | 9.7 | 51 | | | WDS |
| 40 | 34.8 | 8.2 | 41.2 | 5.0 | 10.9 | WDS |
| 41 | 36.3 | 15.5 | 48.2 | | | WDS |
| 42 | 30.1 | 11.8 | 38.0 | 6.1 | 14.0 | WDS |
| 43 | 36.5 | 18.7 | 44.8 | | | WDS |
| 44 | 28.6 | 15.2 | 35.1 | 6.2 | 15.1 | WDS |

A sample number is associated with each active material listed in the table and will be used to refer to devices containing the respective active material in the discussion below. Compositions denoted "nominal" were determined from the compositions of the target used in the deposition. If more than one target was used, the nominal composition was determined as a power-weighted average of the compositions of the individual targets. Compositions denoted "WDS" were determined from wavelength dispersive x-ray spectroscopy and compositions denoted "EDX" were determined from energy dispersive x-ray spectroscopy. The WDS and EDX measurements were performed on thin film samples formed on an aluminum or stainless steel substrate and were completed with a FIB/SEM analytical instrument. In the case of EDX measurements of samples that included $SiO_2$ as the inactive component, the detection limits of the instrument precluded a determination of oxygen. For these samples, the remaining elements were determined with EDX, the oxygen concentration was assumed to be twice the silicon concentration, and the total concentration of all elements was normalized to 100% in the table.

In addition to using atomic concentrations of individual elements, the concentration of each of the samples may be expressed as one or more ratios of the atomic concentration of one element to another element in the composition. The composition of Sample 16, for example, is $Ge_{39.2}Sb_{7.3}Te_{44.1}Si_{3.2}O_{6.2}$. The ratio of Ge to Sb in Sample 16, for example, is 39.2/7.3=5.4 and may be used as a compositional indicator of Sample 16. Similarly, the ratio of Ge to Si in sample 16 is 39.2/3.2=12.3. Ratios of any combination of elements within either the phase-change component or dielectric component of any of the samples may be used as indicators of composition. Similarly, ratios of an element from the phase-change component to an element from the dielectric component of any of the samples may be used as an indicator of composition.

Another way of expressing the composition of the samples is to separately specify the sum of the atomic percentages of the elements comprising the phase-change component and the dielectric component. The phase-change component of Sample 16 is $Ge_{39.2}Sb_{7.3}Te_{44.1}$ and the dielectric component of Sample 16 is $Si_{3.2}O_{6.2}$. The concentration of the phase-change component in Sample 16 may be stated to be 90.6%, which is the sum of the atomic concentrations (expressed as percentages) of Ge, Sb, and Te in the composition. Similarly, the concentration of the dielectric component in Sample 16 may be expressed as 9.4%, which is the sum of the atomic concentrations (expressed as percentages) of Si and O in the composition. This measure of concentration also corresponds to the relative molar proportions or mole fractions of the phase-change component and dielectric component in the composition. Sample 16, for example, may be stated to include a mole fraction of the phase-change component of 90.6% and a mole fraction of the dielectric component of 9.6%. The compositions of any of the samples may be expressed analogously.

As the concentration of the inactive component in the composite material increases, the concentration of the phase-change component necessarily decreases. In order to facilitate comparisons between compositions containing different concentrations of the inactive component, it may be helpful to normalize the concentrations of the elements of the phase-change component. Sample 22, for example, includes a high concentration of dielectric component and has the composition $Ge_{23.9}Sb_{7.9}Te_{37.2}Si_{10.8}O_{20.2}$. The atomic concentration of the dielectric component may be expressed as 31.0% and the atomic concentration of the phase-change component may be expressed as 69.0% based on the sum of the atomic concentrations of the elements of each component. The concentrations of the elements of the phase-change component can be normalized by rescaling their sum to 100%, while maintaining their proportions (ratios) relative to each other and weighting by 0.69. Applying this procedure, the composition of Sample 22 may be written $(Ge_{34.6}Sb_{1.4}Te_{53.9})_{0.690}Si_{10.8}O_{20.2}$. From the normalization procedure, it becomes clear what the relative proportions of the elements of the phase-change component of Sample 22 are. Sample 22 may thus be viewed approximately as an $SiO_2$-enriched variant of a non-composite material having the composition $Ge_{35}Sb_{11}Te_{54}$. If desired, an analogous normalization of the elements of the inactive component may also be performed. The composition of any of the samples may be expressed similarly.

Figure 4:
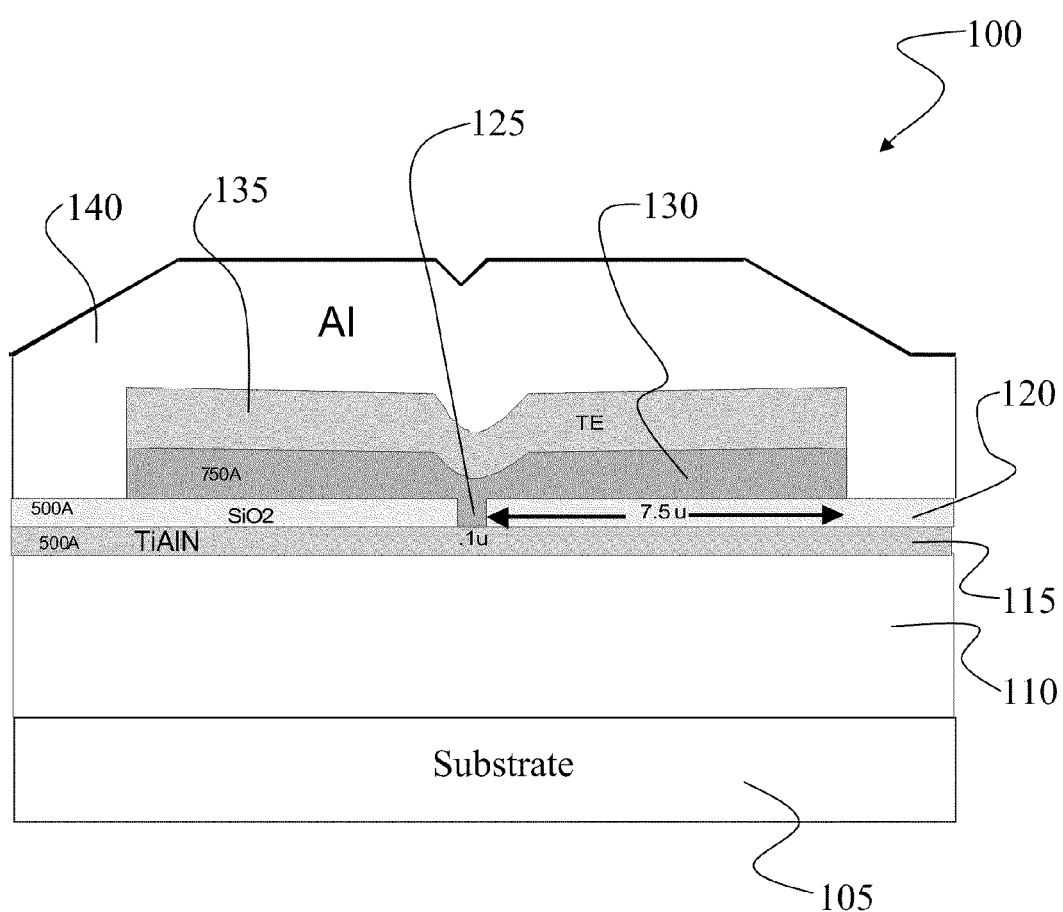
FIG. 4 depicts a phase-change device structure used to test data retention and other characteristics of compositions within the scope of the instant invention.

The sputtering conditions used to form the thin films for compositional analysis were identical to the conditions used to form active materials in the device structure shown in FIG. 4 that were used in the measurements described hereinbelow. Wafers or coupons containing several devices of the type shown in FIG. 4 were fabricated with each of the active material compositions listed in the table above and the experiments described hereinbelow were performed on multiple devices with each of the active material compositions.

EXAMPLE 2

In this example, the data retention characteristics of devices incorporating several of the active materials listed in Example 1 are described. The objective of the data retention experiments was to assess the thermal stability of the structural state of the active material of the device. Since, as noted hereinabove, the crystallization temperature is less than the melting temperature, the crystallization temperature typically limits the thermal stability of a phase-change material and data integrity is most likely to be compromised at elevated temperature through unintended thermally-induced crystallization of the phase-change material. Accordingly, the data retention experiments were designed to probe the tendency of the active material of the devices to crystallize at elevated temperature.

In the data retention experiments, the device was heated to a pre-determined temperature and transformed to a reset state with one or more electrical current pulses. Each reset pulse was typically a square pulse with a current amplitude of ~125% of the saturated reset current. Test measurements indicated that for most active materials, the data retention results were only weakly sensitive to pulse duration. In the data reported herein, a single pulse duration from within the range of 50 ns-10 μs was used for a given device. After the device was reset, it was maintained at the pre-determined elevated temperature and the resistance was measured as a function of time. In the initial reset state, the resistance of the device was high. Maintaining the device at the pre-determined elevated temperature was intended to induce crystallization and the purpose of the experiment was to determine the time required to induce crystallization. Thermally unstable devices undergo crystallization in a short period of time at relatively low temperatures. The higher the temperature and/or the longer the time required for crystallization, the greater the thermal stability of the memory material or memory device.

In the data retention experiments, crystallization was detected as a decrease in device resistance. The time of crystallization was selected to be the time required for the resistance to decrease to a level below a small multiple (~2-3) of the set resistance of the device. The scenario simulated by the data retention experiments is binary device operation. In binary operation, two memory states are employed and a reference resistance intermediate between the reset and set resistances is selected as a demarcation to identify the two states during read. It is typical in binary operation to select a demarcation level that is a small multiple of the set resistance. If the resistance determined upon reading the device is above the demarcation, the device is deemed to be in the reset state and if the resistance determined upon reading the device is below the demarcation, the device is deemed to be in the set state.

The data retention experiment was repeated for several pre-determined elevated temperatures to determine the variation in the time required for crystallization with temperature. The data was recorded in an Arrhenius plot that showed the time required for crystallization (on a log scale) as a function of $(kT)^{-1}$, where k is Boltzmann's constant and T is temperature in absolute units. From the Arrhenius plot, the activation energy of the crystallization time for each device could be determined and extrapolations could be made to longer times to predict temperatures at which data retention could be expected for time periods beyond the practical limits of the experiment (e.g. ten years).

Figure 5:
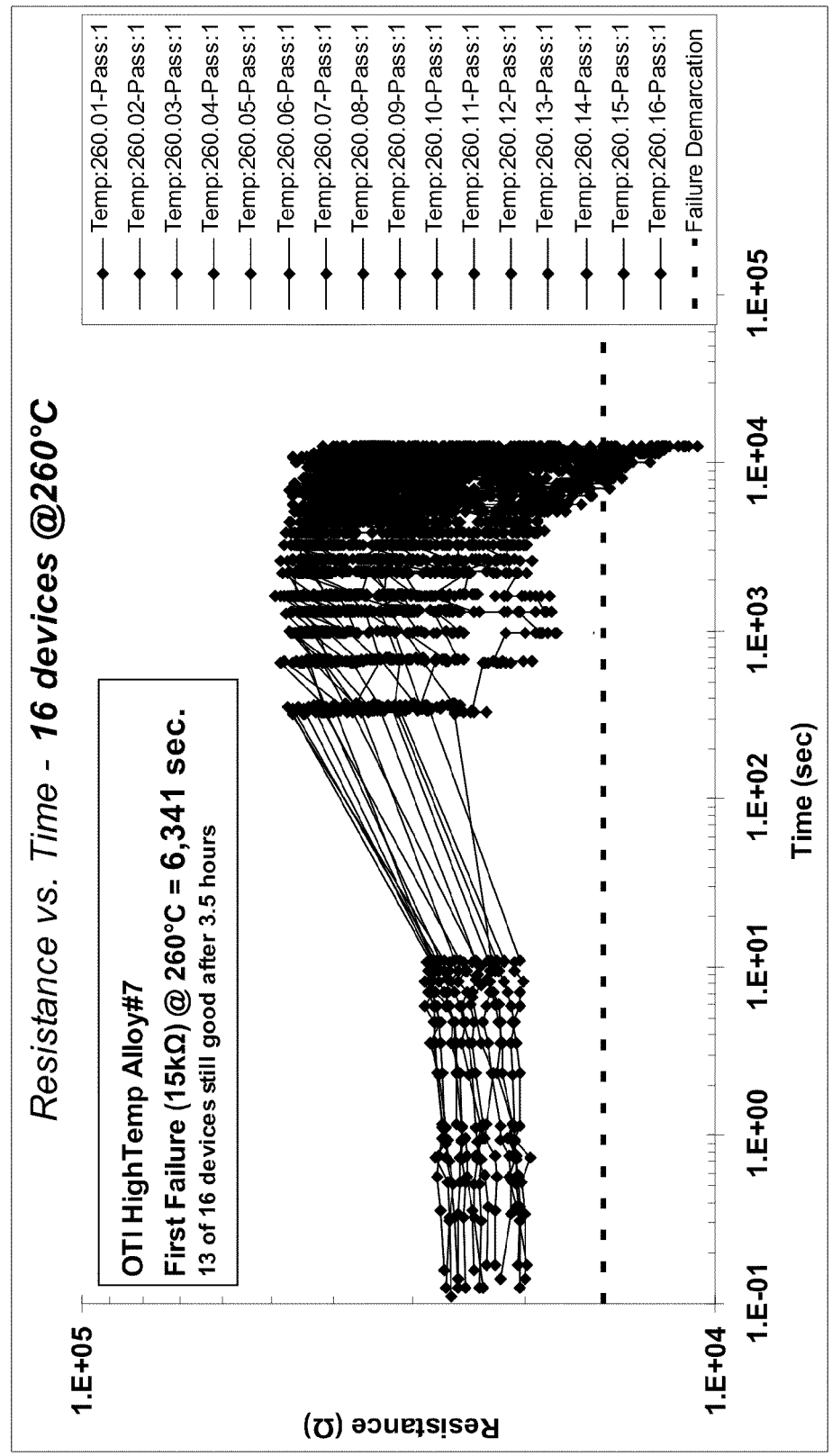
FIG. 5 shows the evolution of resistance with time at 260° C. for several devices incorporating a representative composite active material (Sample 7) in accordance with the instant invention.

FIG. 5 depicts data retention curves at 260° C. for a wafer of devices utilizing Sample 7 ($Ge_{39.1}Sb_{5.6}Te_{42.0}Si_{4.5}O_{8.9}$) as the active material. The wafer included 16 devices and FIG. 5 shows the variation of resistance of each of the devices as a function of time up to 3.5 hours (12,600 sec) following application of a 10 μs reset pulse having a voltage sufficient to deliver a current of ~120% of the saturation current of the device through the device. At 260° C., the reset resistance of each of the devices was ~20-30 kΩ and the set resistance was ~7 kΩ. FIG. 5 shows a separate data retention curve for each of the 16 devices. The data retention curves indicated that the resistance of each device was approximately constant over the first ~10 sec following application of the reset pulse and that the resistance of each device subsequently increased at intermediate times (~10 sec to a few thousand seconds) before decreasing precipitously at longer times (above a few thousand seconds and approaching $10^4$ sec). The increase in resistance observed at intermediate times is a resistance drift effect commonly observed in phase-change devices and the precipitous decrease in resistance observed at longer times is caused by crystallization. Crystallization corresponds to a transformation of the device from an initial high resistance reset state to a low resistance set state and marks a loss in the capacity of the device to retain data.

The data retention time is the time required for the device to crystallize following application of the reset pulse. In FIG. 5, the demarcation point of crystallization was selected to be a resistance of 15 kΩ (approximately twice the set resistance) and is indicated with a horizontal dashed line. The data retention time is accordingly the time required for the resistance of the device to decrease to 15 kΩ. The results of FIG. 5 indicate that the data retention time varied for the different devices on the wafer, but that no device crystallized until 6341 sec (~1.8 hr). (The time at which the first device of a series of nominally equivalent devices on a wafer crystallizes may be referred to herein as the time of first failure. The device that crystallizes first may be referred to herein as the weakest bit.) The data indicate that after 3.5 hours, 13 of the 16 devices on the wafer had not yet failed (crystallized) and thus still retained their initial data state (relative to the demarcation point).

Figure 6:
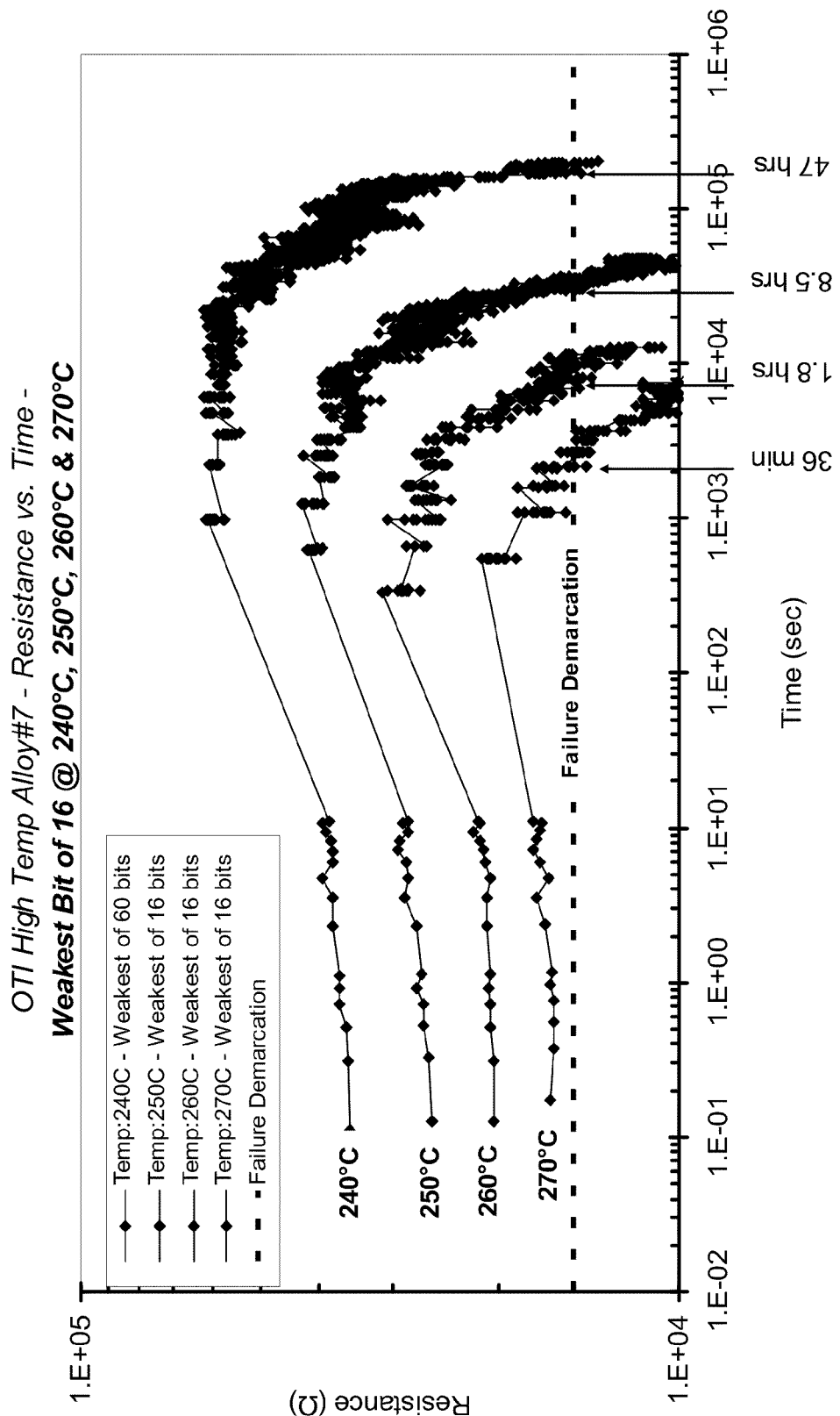
FIG. 6 shows the representative evolution of resistance with time at various temperatures between 240° C. and 270° C. for a device incorporating a representative composite material (Sample 7) in accordance with the instant invention.

The experiment was repeated over a series of fixed temperatures. At each temperature, data retention curves of the type shown in FIG. 5 were obtained and data retention times were determined. FIG. 6 compares the results obtained for the weakest bit at temperatures of 240° C., 250° C., 260° C., and 270° C. The results show that the device resistance generally decreases with increasing temperature, but that the overall shape of the data retention curve is similar at each temperature. FIG. 6 also depicts the 15 kΩ demarcation line and indicates the time of failure (crystallization) at each temperature. The time of failure ranged from 47 hr at 240° C. to 36 min at 270° C.

Figure 7:
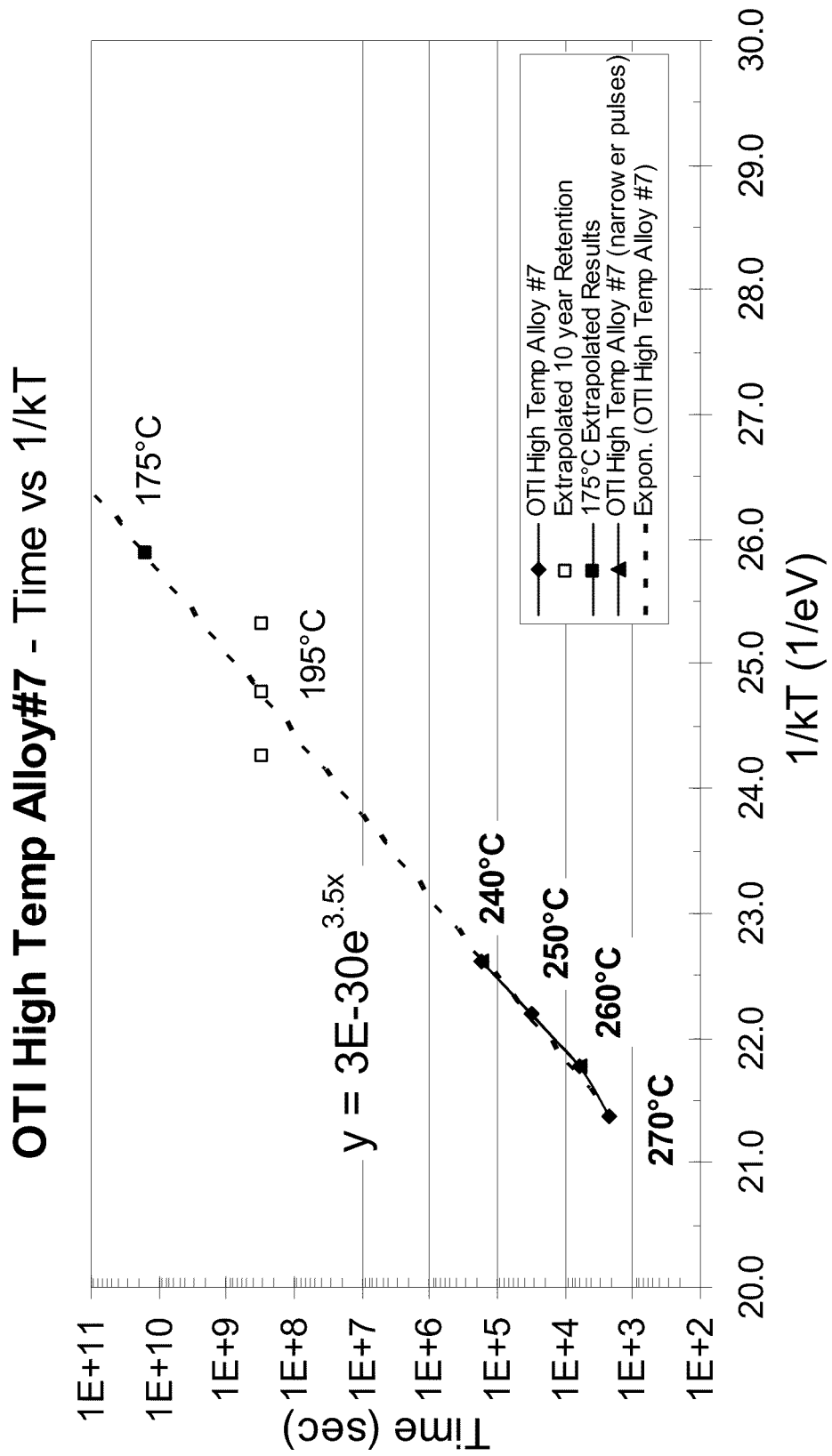
FIG. 7 shows an Arrhenius plot of the data retention time as a function of temperature for a device incorporating a representative composite material (Sample 7) in accordance with the instant invention.

FIG. 7 shows the temperature dependence of the time of first failure of devices utilizing Sample 7. The data are presented in an Arrhenius format that shows the time of first failure (on a log scale) as a function of 1/kT, where k is Boltzmann's constant, T is temperature in absolute units, and slope is the activation energy of the relationship between retention time and temperature. The data retention times shown in FIG. 6 at 240° C., 250° C., 260° C., and 270° C. are labeled in FIG. 7. FIG. 7 further includes extrapolated data points at 195° C. and 175° C. The data point at 195° C. corresponds to a time of 10 years and indicates that devices utilizing Sample 7 are expected to retain data at 195° C. for 10 years. At 175° C., the devices are expected to retain data for ~475 years. The activation energy of the relationship is ~3.5 eV.

Analogous data retention experiments were completed for devices utilizing several of the active materials described in Example 1. Experimental conditions (reset pulse duration and amplitude, temperature range, demarcation resistance etc.) were adjusted according to the characteristics of the active material of each device. A summary of measured data retention times at selected temperatures (expressed in units of seconds (sec), hours (hr), or years (yr)), extrapolated data retention time at selected temperatures (marked with an asterisk), extrapolated 10-year retention temperatures (° C.), and activation energies ($E_{Act}$ (eV)) is provided in the tables below. The measured data retention times correspond to the crystallization time of the first device to crystallize out of a set of between 4 and 24 nominally equivalent devices.

| T (° C.) | Sample | | | | |
|---|---|---|---|---|---|
| | 4 | 3 | 5 | 7 | 14 |
| 135 | | | | 127 yr* | |
| 160 | | | | | |
| 175 | 2000 hr* | 56 hr* | 3900 hr* | | |
| 185 | | | | | |
| 200 | | | | | |
| 210 | 29.2 hr | | | | 8.2 hr |
| 220 | | | | | 3.8 hr |
| 225 | | 884 sec | | | |
| 230 | 8159 sec | 562 sec | | | 2.8 hr |
| 235 | 4698 sec | | | | |
| 240 | 442 sec | | 4385 sec | | 8541 sec |
| 245 | | 148 sec | | | |
| 250 | 92 sec | | 1700 sec | 8.5 hr | 1366 sec |
| 260 | 12 sec | | 36 sec | 550 sec | 6341 sec | 173 sec |
| 270 | | | | 2146 sec | |
| 10-Year | 150° C. | 121° C. | 154° C. | 190° C. | 137° C. |
| $E_{Act}$ | 2.2 eV | 2.1 eV | 2.4 eV | 3.3 eV | 2.1 eV |

| T (° C.) | Sample | | | | | |
|---|---|---|---|---|---|---|
| | 6 | 16 | 18 | 22 | 32 | 42 |
| 175 | 15.5 yr* | | | | | |
| 260 | 15.3 hr | 48.2 hr | 70.4 hr | 24.5 hr | 49.2 hr | 4.7 hr |
| 270 | | | | | 1000 sec | 1572 sec |
| 275 | | 4.0 hr | 1132 sec | 4900 sec | 474 sec | |
| 280 | 9600 sec | 4699 sec | | | | 71 sec |
| 285 | | | 340 sec | 570 sec | 200 sec | |
| 295 | | | | | 6 sec | |
| 300 | 1987 sec | | | | | |
| 10-Year | 178° C. | 218° C. | 235° C. | 224° C. | 242° C. | 228° C. |
| $E_{Act}$ | 2.2 eV | 4.3 eV | 7.0 eV | 5.1 eV | 9.9 eV | 6.95 eV |

| T (° C.) | Sample | | | | |
|---|---|---|---|---|---|
| | 24 | 26 | 37 | 1 | 8 |
| 135 | | 157.4 hr | | | |
| 155 | | | 3329 sec | | |
| 160 | 7615 sec | | | | |
| 165 | | | 952 sec | | |
| 175 | 1334 sec | | | | 1028 hr* |
| 180 | | | 86 sec | 6731 sec | |
| 185 | 566 sec | | | 2876 sec | 126 hr |
| 190 | | | | 1426 sec | |
| 195 | | | | 1035 sec | |
| 200 | 11 sec | 395 sec | 6 sec | 492 sec | |
| 205 | | | | | 6347 sec |
| 220 | | | | | 519 sec |
| 260 | 0.1 sec* | 34 sec | | | 0.5 sec* |
| 10-Year | 108° C. | 79° C. | 93° C. | 110° C. | 155° C. |
| $E_{Act}$ | 2.8 eV | 1.5 eV | 2.5 eV | 2.3 eV | 3.8 eV |

The data retention results reveal that addition of an inactive dielectric component to a phase-change material led to an improvement in the data retention characteristics for many of the devices. The effect, however, was not universal and the extent to which the effect was manifested varied with the composition of the phase-change component and the amount of dielectric component included in the composite material. The discussion that follows illustrates representative conclusions discernible from the retention data.

One measure of data retention is stability at elevated temperature. Samples 6, 7, and 8 represent a series of devices that included an increasing proportion of a dielectric component ($SiO_2$) in a composite phase-change material. In Samples 6, 7, and 8, the normalized atomic concentration of the elements of the phase-change component of the composition was approximately constant. Sample 8 had a composition of $Ge_{45.9}Sb_{6.0}Te_{48.2}$, included no dielectric component, and had a data retention time of 519 sec at 220° C. Upon inclusion of a dielectric component in Sample 7 ($Ge_{39.1}Sb_{5.6}Te_{42.0}Si_{4.5}O_{8.9}$ or $(Ge_{45.1}Sb_{6.5}Te_{48.4})_{0.867}Si_{4.5}O_{8.9}$ (normalized)) and Sample 6 ($Ge_{36.4}Sb_{5.8}Te_{38.7}Si_{6.4}O_{12.7}$ or $(Ge_{45.0}Sb_{7.2}Te_{47.8})_{0.809}Si_{6.4}O_{12.7}$ (normalized)), an improvement in data retention was observed. The data retention time of Sample 7, for example, at 260° C. (6341 sec) was similar to the data retention time of Sample 8 at 205° C. (6347 sec). Sample 6 included a higher amount of the dielectric component than Sample 7 and showed a further improvement in the retention of data at high temperatures, including an ability to retain data at 300° C. for over 30 min. The results for Samples 6, 7, and 8 indicate that the ability of the active material to retain data at high temperatures increases with increasing dielectric content.

A similar trend was observed across the series Sample 14 ($Ge_{41.5}Sb_{9.1}Te_{49.4}$), Sample 16 ($Ge_{39.2}Sb_{7.3}Te_{44.1}Si_{3.2}O_{6.2}$ or $(Ge_{43.3}Sb_{8.1}Te_{48.7})_{0.906}Si_{3.2}O_{6.2}$ (normalized)), Sample 18 ($Ge_{32.1}Sb_{6.9}Te_{37.2}Si_{7.4}O_{16.4}$ or $(Ge_{42.1}Sb_{9.1}Te_{48.8})_{0.762}Si_{7.4}O_{16.4}$ (normalized)), and Sample 22 ($Ge_{23.9}Sb_{7.9}Te_{37.2}Si_{10.8}O_{20.2}$ or $(Ge_{34.6}Sb_{11.4}Te_{53.9})_{0.690}Si_{10.8}O_{20.2}$ (normalized)). The data retention time at 260° C., for example, increased from 173 sec (Sample 14) to 48.2 hr (Sample 16) to 70.4 hr (Sample 18) as the dielectric content increased. A further increase in dielectric content from Sample 18 to Sample 22, however, led to a reduction in the data retention time at 260° C. from 70.4 hr to 24.5 hr. This series of devices indicates that the addition of a dielectric component improves the data retention time at elevated temperature up to a particular concentration limit and the effect begins to reverse if the concentration of dielectric component exceeds the limit.

The concentration of the dielectric component in the foregoing samples extended from zero (Samples 8, 14) up to 31.0% (Sample 22). The results indicate that improved data retention characteristics relative to Samples 8 and 14 were observed for each of the samples that included a dielectric component. From the samples that included a dielectric component, Sample 16 had the lowest concentration (9.4%) and exhibited significantly better data stability at elevated temperatures than Samples 8 and 14. Sample 22 had the highest concentration of dielectric component (31.0%) and similarly exhibited much better data stability at elevated temperatures than Samples 8 and 14. Within this group of samples, the best data retention characteristics were observed in Sample 18, which had a dielectric concentration of 23.8%.

Based on the trend observed as the dielectric concentration was decreased from 23.8% (Sample 18), it is expected that enhanced data retention characteristics relative to Samples 8 and 14 will be observed beyond the 9.4% lower limit (Sample 16) of this group of samples to a dielectric concentration of about 5%. As the dielectric concentration was increased above 23.8% (Sample 18) to 31.0% (Sample 22), only a gradual change in data retention characteristics was observed. Based on the gradual trend, the beneficial effect of incorporating a dielectric component is expected to extend up to a concentration of about 50%.

In one embodiment, the concentration of dielectric component (expressed as the sum of the atomic concentrations of the constituent elements thereof) in the instant composite materials is between 5% and 50%. In another embodiment, the concentration of dielectric component (expressed as the sum of the atomic concentrations of the constituent elements thereof) in the instant composite materials is between 9% and 35%. In still another embodiment, the concentration of dielectric component (expressed as the sum of the atomic concentrations of the constituent elements thereof) in the instant composite materials is between 13% and 30%. In a further embodiment, the concentration of dielectric component (expressed as the sum of the atomic concentrations of the constituent elements thereof) in the instant composite materials is between 18% and 25%.

The results also show that the incorporation of a dielectric component affects the variation of the data retention time with temperature. This effect is reflected in differences in the activation energy obtained from the Arrhenius plots observed for the different samples. A high activation energy signifies a strong variation in data retention time with temperature, while a low activation energy signifies a weak variation. The effect of incorporating a dielectric component into the composition on activation energy was inconsistent. A decrease in activation energy with increasing the concentration of the dielectric component was observed across the series of devices from Sample 8 (3.8 eV) to Sample 7 (3.3 eV) to Sample 6 (2.2 eV). An opposite trend was observed, however, as the concentration of the dielectric component was increased from Sample 14 (2.1 eV) to Sample 16 (4.3 eV) to Sample 18 (7.0 eV). This trend reversed upon a further increase in the concentration of the dielectric component from Sample 18 to Sample 22 (5.1 eV). These results indicate that there is no predictability in the effect of the concentration of the dielectric component on the activation energy of a composite material.

One consequence of the variable effect of the dielectric component on the activation energy is that it leads to difficulty in predicting which composite composition has the best data retention characteristics. This follows because different composite compositions may provide the longest data retention time at different temperatures. As noted hereinabove, for example, Sample 18 exhibited a longer data retention time at 260° C. than Sample 16 (70.4 hr vs. 48.2 hr). The data indicate, however, that at 275° C., the data retention time of Sample 16 (4.0 hr) was longer than the data retention time of Sample 18 (1132 sec (0.31 hr)). The composite material best suited for a particular condition of operation thus cannot be predicted from composition or the concentration of the dielectric component alone.

Another consequence of the variable effect of the dielectric component on the activation energy is that the relationship of the 10-year retention temperature to data retention times observed at high temperature is uncertain. As noted hereinabove, the 10-year retention temperature is the temperature at which a device can be expected to retain the integrity of data for 10 years. A comparison of Sample 6 and Sample 7, for example, shows that at 260° C., Sample 6 had a much longer data retention time than Sample 7 (15.3 hr vs. 6341 sec (1.8 hr)). The 10-year retention temperature for Sample 6 (178° C.), however, was lower than the 10-year retention temperature for Sample 7 (190° C.). A comparison of Sample 8 and Sample 14 provides another example of unpredictability. The data retention time for Sample 8 at 220° C. was 519 sec. For Sample 14, the results indicate that the data retention time at 250° C. was 1366 sec and that it decreased to 519 sec at some temperature between 250° C. and 260° C. Despite the much longer data retention time observed for Sample 14 relative to Sample 8, the 10-year retention temperature of Sample 14 (137° C.) was significantly lower than the 10-year retention temperature of Sample 8 (155° C.). A similar outcome was observed for Sample 24 ($Ge_{50.9}Te_{39.6}Si_{2.83}O_{5.66}$) and Sample 26 ($Ge_{40.3}Te_{29.8}Si_{9.7}O_{19.4}$). The data retention time observed at 200° C. was 11 sec for Sample 24 and 395 sec for Sample 26. The data retention time at 260° C. (34 sec) for Sample 26 was longer than the data retention time at 200° C. (11 sec) for Sample 24. Despite the longer data retention times at higher temperature, however, the 10-year data retention temperature of Sample 26 (79° C.) was lower than the 10-year data retention temperature of Sample 24 (108° C.).

The retention results also indicate that incorporation of a dielectric component to form a composite material does not always improve data retention characteristics. Sample 1 devices included the phase-change material $Ge_{22}Sb_{22}Te_{56}$ without a dielectric component as the active material. The active material in Sample 37 devices was a composite material having the composition $Ge_{19.0}Sb_{17.0}Te_{40.4}Si_{7.4}O_{16.3}$ (or, when normalized, $(Ge_{24.9}Sb_{22.3}Te_{52.9})_{0.764}Si_{7.4}O_{16.3}$). Sample 37 was prepared from a composite target that included a combination of $Ge_{22}Sb_{22}Te_{56}$ and $SiO_2$ with the objective of obtaining a variant of Sample 1 that included a dielectric component. As seen from the normalized composition, the composition of the phase-change component of Sample 37 was similar to the composition of Sample 1. The retention results showed that the presence of a dielectric component in Sample 37 led to a deterioration in data retention characteristics relative to Sample 1. At 200° C., for example, the data retention time of Sample 1 was 492 sec, while the data retention time of Sample 37 was only 6 sec. The data retention time of Sample 1 at 180° C. (6731 sec) was more than twice the data retention time of Sample 37 at 155° C. (3329 sec). Inclusion of the dielectric component also led to a decrease in the 10-year data retention temperature (110° C. for Sample 1, but only 93° C. for Sample 37). The results thus show that incorporation of a dielectric component does not necessarily lead to an improvement in data retention characteristics and indicate that the composition of the phase-change component influences the effect of the dielectric component on data retention.

Insight into compositional factors that affect the data retention characteristics of the instant composite materials can be obtained from the results reported above. One noteworthy observation is that samples that lacked Sb exhibited significantly poorer data retention characteristics than samples that included Sb. Sample 24, for example, lacked Sb and had the composition $Ge_{50.9}Te_{39.6}Si_{2.83}O_{5.66}$ (or, when normalized, $(Ge_{56.1}Te_{43.6})_{0.908}Si_{2.83}O_{5.66}$), while Sample 16 included Sb and had the composition $Ge_{39.2}Sb_{7.3}Te_{44.1}Si_{3.2}O_{6.2}$ (or, when normalized, $(Ge_{43.4}Sb_{8.1}Te_{48.7})_{0.906}Si_{3.2}O_{6.2}$). The dielectric concentration was similar for Sample 24 and Sample 16, but the data retention characteristics differed greatly. Sample 24 devices exhibited a 10-year data retention temperature of 108° C. and a data retention time at 200° C. of only 1 sec. Sample 16 devices, on the other hand, exhibited a 10-year data retention temperature of 218° C. and a data retention time at 280° C. of 1.3 hr. Samples 22 and 26 showed a similar effect at a much higher concentration of the dielectric component. Sample 26 had the composition $Ge_{40.3}Te_{29.8}Si_{9.7}O_{19.4}$ (or, when normalized, $(Ge_{57.5}Te_{42.5})_{0.701}Si_{9.7}O_{19.4}$) and exhibited a 10-year retention temperature of only 79° C. and a data retention time at 260° C. of only 34 sec. Sample 22, in contrast, included an appreciable concentration of Sb and had the composition $Ge_{23.9}Sb_{7.9}Te_{37.2}Si_{10.8}O_{20.2}$ (or, when normalized, $(Ge_{34.6}Sb_{11.4}Te_{53.9})_{0.690}Si_{10.8}O_{20.2}$). Sample 22 devices exhibited a 10-year data retention temperature of 224° C. and a data retention time at 260° C. of 24.5 hr.

The results indicate that the inclusion of Sb in the phase-change component and/or alterations in the concentration ratios of Ge:Sb or Te:Sb of the phase-change component had a significant influence on the data retention characteristics of alloys incorporating similar concentrations of the dielectric component. To better understand the effect of the composition of the phase-change component on data retention characteristics, it is helpful to compare a series of samples that differ in Sb concentration and/or the relative proportions of Ge, Sb, and Te in the phase-change component. The tables below list the normalized composition and concentration ratios of selected elements of several of the samples considered above as well as data retention times at selected temperatures and the 10-year data retention temperature. The concentration ratios correspond to the ratio of atomic concentration (or percent) of the indicated elements.

elevated temperatures. Inclusion of Sb in the phase-change component led to a significant improvement in data retention characteristics across the series of Samples 7, 6, 16, 18, 22, 42 and 32. Each of these samples exhibited a high 10-year data retention temperature and a long retention time at elevated temperature. When the concentration of Sb was further increased in Sample 37, however, a pronounced deterioration of data retention characteristics was observed. The 10-year retention temperature and data retention time at 200° C. observed for Sample 37 was similar to those observed for Sample 24.

The retention data indicates that the presence of Sb in the phase-change component provides a beneficial effect on data retention characteristics only over a certain range of concentrations and that the onset of the beneficial effect occurs unexpectedly over a narrow range of Sb concentrations at both the high and low ends of the range. The data also suggest that particularly favorable data retention characteristics are observed for Sb concentrations in the vicinity of those present in Samples 18 and 32. Sample 42 has an Sb concentration intermediate between those observed in Samples 18 and 32 and has data retention characteristics that are not quite as favorable.

One way to express the preferred Sb concentrations is in terms of atomic concentration (or percentage) in the overall composition of the composite material. By this measure, the results indicate that exclusion of Sb or an Sb concentration of 17% or higher is detrimental to data retention, while inclusion of a few atomic percent of Sb or an Sb concentration of slightly below 17% is beneficial to data retention. In one

| Sample | Composition | Normalized Composition | Sb/Ge | Sb/Te | Ge/Te |
|---|---|---|---|---|---|
| 24 | $Ge_{50.9}Te_{39.6}Si_{2.8}O_{5.7}$ | $(Ge_{56.1}Te_{43.6})_{0.908}Si_{2.8}O_{5.7}$ | 0 | 0 | 1.29 |
| 26 | $Ge_{40.3}Te_{29.8}Si_{9.7}O_{19.4}$ | $(Ge_{57.5}Te_{42.5})_{0.701}Si_{9.7}O_{19.4}$ | 0 | 0 | 1.35 |
| 7 | $Ge_{39.1}Sb_{5.6}Te_{42.0}Si_{4.5}O_{8.9}$ | $(Ge_{45.1}Sb_{6.5}Te_{48.4})_{0.867}Si_{4.5}O_{8.9}$ | 0.14 | 0.13 | 0.93 |
| 6 | $Ge_{36.4}Sb_{5.8}Te_{38.7}Si_{6.4}O_{12.7}$ | $(Ge_{45.0}Sb_{7.2}Te_{47.8})_{0.809}Si_{6.4}O_{12.7}$ | 0.16 | 0.15 | 0.94 |
| 16 | $Ge_{39.2}Sb_{7.3}Te_{44.1}Si_{3.2}O_{6.2}$ | $(Ge_{43.3}Sb_{8.1}Te_{48.7})_{0.906}Si_{3.2}O_{6.2}$ | 0.19 | 0.17 | 0.89 |
| 18 | $Ge_{32.1}Sb_{6.9}Te_{37.2}Si_{7.4}O_{16.4}$ | $(Ge_{42.1}Sb_{9.1}Te_{48.8})_{0.762}Si_{7.4}O_{16.4}$ | 0.22 | 0.19 | 0.86 |
| 22 | $Ge_{23.9}Sb_{7.9}Te_{37.2}Si_{10.8}O_{20.2}$ | $(Ge_{34.6}Sb_{11.4}Te_{53.9})_{0.69}Si_{10.8}O_{20.2}$ | 0.33 | 0.21 | 0.64 |
| 42 | $Ge_{30.1}Sb_{11.8}Te_{38.0}Si_{6.1}O_{14.0}$ | $(Ge_{37.7}Sb_{14.8}Te_{47.6})_{0.799}Si_{6.1}O_{14.0}$ | 0.39 | 0.31 | 0.79 |
| 32 | $Ge_{30.5}Sb_{14.5}Te_{33.5}Si_{7.2}O_{14.2}$ | $(Ge_{38.3}Sb_{18.2}Te_{42.1})_{0.796}Si_{7.2}O_{14.2}$ | 0.48 | 0.43 | 0.91 |
| 37 | $Ge_{19.0}Sb_{17.0}Te_{40.4}Si_{7.4}O_{16.3}$ | $(Ge_{24.9}Sb_{22.3}Te_{52.9})_{0.764}Si_{7.4}O_{16.3}$ | 0.89 | 0.42 | 0.47 |

| Sample | Sb/Ge | Sb/Te | Ge/Te | T (° C.) | Time | 10-Year (° C.) |
|---|---|---|---|---|---|---|
| 24 | 0 | 0 | 1.29 | 200 | 11 sec | 108 |
| 26 | 0 | 0 | 1.35 | 260 | 34 sec | 79 |
| 7 | 0.14 | 0.13 | 0.93 | 260 | 6341 sec | 190 |
| 6 | 0.16 | 0.15 | 0.94 | 260 | 15.3 hr | 178 |
| 16 | 0.19 | 0.17 | 0.89 | 260 | 48.2 hr | 218 |
| 18 | 0.22 | 0.19 | 0.86 | 260 | 70.4 hr | 235 |
| 22 | 0.33 | 0.21 | 0.64 | 260 | 24.5 hr | 224 |
| 42 | 0.39 | 0.31 | 0.79 | 260 | 4.7 hr | 228 |
| 32 | 0.48 | 0.43 | 0.91 | 260 | 49.2 hr | 242 |
| 37 | 0.89 | 0.42 | 0.47 | 200 | 6 sec | 93 |

The results indicate that the data retention characteristics of samples that include a dielectric component depend significantly on the composition of the phase-change component. In particular, the presence of Sb (antimony) in the composition appears to greatly influence the effect of the dielectric component on data retention characteristics. Poor data retention was observed for the two samples (Samples 24 and 26) that contained no Sb. Samples 24 and 26 both had low 10-year retention temperatures and short retention times at embodiment, atomic concentration of Sb is between 3% and 16%. In another embodiment, the atomic concentration of Sb is between 5% and 15%. In still another embodiment, the atomic concentration of Sb is between 6.5% and 12%. In the vicinity of Sample 18, the results suggest an atomic concentration of Sb between 5% and 9%. In the vicinity of Sample 32, the results suggest an atomic concentration of Sb between 13% and 16%.

An alternative way to express the preferred Sb concentration is in terms of its presence relative to other elements in the composite composition. The tables above list the ratio of Sb to both Ge and Te. A comparison of Samples 32 and 37 shows that the two materials include similar concentrations of dielectric component and similar Sb/Te ratios, but widely different Sb/Ge ratios and widely different data retention properties. The Sb/Ge ratio is accordingly proposed as one factor underlying the favorable data retention characteristics observed in Samples 7, 6, 16, 18, 22, 42, and 32. In one embodiment, the Sb/Ge ratio is between 0.07 and 0.68. In another embodiment, the Sb/Ge ratio is between 0.14 and 0.58. In still another embodiment, the Sb/Ge ratio is between 0.16 and 0.48. In a further embodiment, the Sb/Ge ratio is between 0.22 and 0.48. In the vicinity of Sample 18, the results suggest an Sb/Ge ratio between 0.16 and 0.28. In the vicinity of Sample 32, the results suggest an Sb/Ge ratio between 0.43 and 0.53.

The relative amounts of Ge and Te in the phase-change component may also be used to express composition. The data indicate that retention characteristics are poor when the Ge/Te ratio is high (Samples 24 and 26) or low (Sample 37). The data suggests that the best retention characteristics are expected in an embodiment in which the Ge/Te ratio is between 0.6 and 1.1. In another embodiment, the Ge/Te ratio is between 0.75 and 1.0. In still another embodiment, the Ge/Te ratio is between 0.8 and 0.95.

Compositions expressed as described hereinabove in terms of Sb concentration, elemental ratios (Sb/Ge, Sb/Te, Ge/Te), and/or concentration of dielectric component may be combined in other embodiments. A composite material, for example, having an Sb concentration 3% and 16%, and an Sb/Ge ratio between 0.07 and 0.68 is an embodiment of the instant invention. Other embodiments corresponding to other combinations of two or more of the compositional measures described hereinabove are similarly within the scope of the instant invention.

Compositions of the instant composite materials may also be expressed directly in terms of the atomic concentration of one or more elements of the phase-change component and one or more elements of the dielectric component. In one embodiment, the composite material includes a phase-change component comprising Sb and a dielectric component comprising Si. In one embodiment, the atomic concentration of Sb is between 3% and 16% and the atomic concentration of Si is between 2% and 15%. In another embodiment, the atomic concentration of Sb is between 5% and 15% and the atomic concentration of Si is between 3% and 10%. In another embodiment, the atomic concentration of Sb is between 5% and 9% and the atomic concentration of Si is between 5% and 8%. In another embodiment, the atomic concentration of Sb is between 13% and 16% and the atomic concentration of Si is between 5% and 8%.

In addition to Sb, the phase-change component may further include Ge. In one embodiment, the atomic concentration of Ge is between 23% and 45%. In another embodiment, the atomic concentration of Ge is between 30% and 40%. In addition to Si, the dielectric component may include O or N. In one embodiment, the O/Si ratio is between 1.0 and 3.0. In another embodiment, the O/Si ratio is between 1.5 and 2.5. In still another embodiment, the N/Si ratio is between 1.0 and 2.0. In a further embodiment, the N/Si ratio is between 1.1 and 1.5.

The results suggest that a selective synergy between certain phase-change compositions and a dielectric component may be responsible for the improvement in data retention characteristics. Sample 37, for example, has essentially the same concentration of dielectric component as either of Samples 18 and 32 and yet has significantly inferior data retention characteristics. A similar comparison holds for Samples 24 and 16, as well as for Samples 26 and 22. The effect of the electrically-inactive or dielectric component on data retention was observed to be non-universal and to depend on the composition of the phase-change component. This dependence suggests that the tendency of the dielectric component to materially improve the data retention characteristics of some phase-change compositions and not others is related to an influence of the dielectric component on some underlying property of the phase-change component that is essential to crystallization.

As noted hereinabove, data retention is governed by the ability of a phase-change material to resist crystallization at elevated temperature. The process of crystallization includes two important phenomenological steps: nucleation and growth. Nucleation corresponds to the ab initio formation of nuclei of a crystalline phase from the amorphous phase, while growth corresponds to the expansion of the nuclei through accrual of crystalline phase material via conversion of amorphous phase material at the boundaries of the nuclei. Nucleation and growth are competing processes that may occur simultaneously and each is capable of stabilizing a crystalline phase. In nucleation-dominated crystallization, growth of existing crystalline nuclei is slow and crystallization occurs primarily through the formation of new crystalline nuclei. Conversely, in growth-dominated crystallization, enlargement of existing crystalline nuclei is fast and the contribution of newly-formed nuclei to crystallization is secondary.

The relative importance of the nucleation and growth processes varies with the composition of the phase-change material. It is known, for example, that crystallization of $Ge_2Sb_2Te_5$ is nucleation-dominated and that enrichment of $Ge_2Sb_2Te_5$ with Sb to form $Ge_{15}Sb_{47}Te_{38}$ yields a growth-dominated phase-change material. The effect of an incorporated dielectric component on the mechanism of the crystallization process of a phase-change material has not been resolved in the art. It is reasonable to expect, however, that the presence of a dielectric component would affect a nucleation-dominated crystallization process in a different way than a growth-dominated crystallization process. The most basic effect of incorporating a dielectric component into a phase-change material is that the dielectric component is distributed throughout the volume of the phase-change material and has the effect of compartmentalizing the phase-change material into domains or regions that are at least partially bounded by the dielectric component. The physical presence of the dielectric component necessarily breaks the phase-change material up into a plurality of regions that are at least partially segregated. Instead of spanning the full volume of the active region of a device, the spatial extent of the phase-change material is interrupted by the presence of the dielectric component and the phase-change material is divided up into smaller regions.

While not wishing to be bound by theory, it might be expected that the presence of the dielectric component would influence growth-dominated crystallization more than nucleation-dominated crystallization. This hypothesis follows because growth-dominated crystallization occurs through enlargement of existing crystalline regions. Since the presence of the dielectric component creates internal boundaries that limit the extent to which a given crystalline region can be enlarged, crystallization via a growth-dominated mechanism will be inhibited when an expanding crystalline region impinges upon the dielectric component. Once a crystalline region enlarges to the maximum size permitted by the distribution of dielectric component within the phase-change material, growth of that region terminates. Since the growth of all crystalline domains will be similarly affected, the overall rate of crystallization via a growth-dominated mechanism is expected to decrease in the presence of a dispersed dielectric component. Once crystallization by a growth-dominated mechanism saturates, further crystallization requires nucleation of new crystalline nuclei. Since nucleation is disfavored in growth-dominated phase-change materials, higher temperatures are needed to induce it (relative to the temperatures needed to induce growth). As a result, it can be expected that the presence of a dielectric component inhibits crystallization of growth-dominated phase-change materials and necessitates the need for higher temperatures in order to achieve crystallization.

In nucleation-dominated phase-change materials, the presence of a dielectric component would be expected to exert a lesser effect on the crystallization process. This follows because nucleation-dominated crystallization does not depend on the ability of crystalline regions to expand spatially. Whereas the growth-dominated mechanism achieves crystallization through the enlargement of a relatively small number of crystalline regions, the nucleation-dominated mechanism achieves crystallization through the development of a large number of relative small crystalline regions. As a result, nucleation-dominated crystallization is expected to be much less sensitive to the spatial boundaries imposed by the presence of a dielectric component.

One possible explanation of the trends in the data retention characteristics noted hereinabove for the instant composite materials is that the growth-dominated crystallization process is relatively more important in the materials that exhibit favorable data retention characteristics (as delineated in the ranges of composition and/or elemental ratios noted hereinabove) than in the materials that exhibit poor data retention characteristics. The phase-change component of Sample 37, for example, has the composition $Ge_{24.9}Sb_{22.3}Te_{52.9}$ and is thus close to the composition $Ge_{22}Sb_{22}Te_{55}$ (Sample 1) that is known in the art to be a nucleation-dominated material. Based on the model presented hereinabove, the presence of a dielectric component would be expected to have a relatively minor effect on its data retention characteristics. A comparison of the data retention characteristics of Samples 1 and 37 bears out this expectation. Although the crystallization mechanism of the phase-change component of Samples 7, 6, 16, 18, 22, 32 and 42 remains unconfirmed, the retention results suggest that growth-dominated crystallization is more important in these samples than in Sample 37. In one embodiment of the instant invention, the active composite material includes a phase-change component and a dielectric component, where the phase-change component comprises a material that crystallizes preferentially by a growth-dominated process.

An alternative synergy between the dielectric component and phase-change component may pertain to the structure of the crystalline state that forms upon crystallization. Known crystalline structures for phase-change materials include a hexagonal close-packed phase and a face-centered cubic phase. The hexagonal close-packed phase is believed to be the thermodynamically more stable phase, but the existence of a face-centered cubic phase may affect the mechanism and/or kinetics of crystallization. Crystallization of $Ge_{22}Sb_{22}Te_{56}$, for example, is known to proceed first through a metastable face-centered cubic phase before ultimate stabilization of the hexagonal close-packed phase. The face-centered cubic phase is believed to be structurally more similar to the arrangement of atoms in the amorphous phase and as a result, it presents a smaller kinetic energy barrier for crystallization and proceeds to crystallize at a lower temperature than does crystallization of the hexagonal close-packed phase directly from the amorphous phase.

Another possible explanation for the observed data retention results is that the presence of the dielectric component influences the crystallization process by inhibiting the formation of a metastable face-centered cubic phase from the phase-change component for selected phase-change compositions. In this model, the presence of the dielectric component inhibits crystallization through the lower temperature metastable pathway and drives the crystallization process through the higher temperature hexagonal close-packed phase. By foreclosing or inhibiting the lower temperature crystallization mechanism that proceeds through the metastable face-centered cubic phase, the dielectric component forces the phase-change component to crystallize directly from the amorphous phase to the hexagonal close-packed crystalline phase. As a result, the temperature needed to induce crystallization is increased and the overall data retention characteristics of the composite material are improved.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

We claim:

1. A composite material comprising:
a phase-change component, said phase-change component comprising Ge, Sb, and Te; said Ge having an atomic concentration in said composite material between 23% and 45%; said Sb having an atomic concentration in said composite material between 3% and 16%; the ratio of said atomic concentration of Sb to said atomic concentration of Ge in said composite material being between 0.07 and 0.68; the ratio of said atomic concentration of Ge to the atomic concentration of Te in said composite material being between 0.6 and 1.1; and
an inactive component dispersed within said phase-change component, said inactive component comprising a dielectric material, the sum of the atomic concentrations of the constituent elements of said dielectric material in said composite material being between 5% and 50%.

2. The composite material of claim 1, wherein said atomic concentration of Sb in said composite material is between 5% and 15%.

3. The composite material of claim 1, wherein said atomic concentration of Ge in said composite material is between 30% and 40%.

4. The composite material of claim 3, wherein said atomic concentration of Sb in said composite material is between 6.5% and 12%.

5. The composite material of claim 1, wherein said ratio of said atomic concentration of Sb to said atomic concentration of Ge ratio in said composite material is between 0.14 and 0.58.

6. The composite material of claim 1, wherein the melting point of said inactive component is higher than the melting point of said phase-change component.

7. The composite material of claim 1, wherein said sum of said atomic concentrations of said constituent elements of said dielectric material in said composite material is between 9% and 35%.

8. The composite material of claim 7, wherein said atomic concentration of Sb in said composite material is between 5% and 15%.

9. The composite material of claim 8, wherein said atomic concentration of Ge in said composite material is between 30% and 40%.

10. The composite material of claim 9, wherein said ratio of said atomic concentration of Sb to said atomic concentration of Ge in said composite material is between 0.14 and 0.58.

11. The composite material of claim 10, wherein said ratio of said atomic concentration of Ge to atomic concentration of Te in said composite material is between 0.75 and 1.0.

12. The composite material of claim 11, wherein said sum of said atomic concentrations of said constituent elements of said dielectric material in said composite material is between 13% and 30%.

13. The composite material of claim 12, wherein said atomic concentration of Sb in said composite material is between 6.5% and 12%.

14. The composite material of claim 13, wherein said ratio of said atomic concentration of Sb to said atomic concentration of Ge in said composite material is between 0.16 and 0.48.

15. The composite material of claim 14, wherein said ratio of said atomic concentration of Ge to said atomic concentration of Te in said composite material is between 0.8 and 0.95.

16. The composite material of claim 15, wherein said sum of the atomic concentrations of said constituent elements of said dielectric material in said composite material is between 18% and 25%.

17. The composite material of claim 16, wherein said ratio of said atomic concentration of Sb to said atomic concentration of Ge in said composite material is between 0.22 and 0.48.

18. The composite material of claim 7, wherein said atomic concentration of Sb in said composite material is between 5% and 9%.

19. The composite material of claim 18, wherein said ratio of the atomic concentration of Sb to said atomic concentration of Ge in said composite material is between 0.16 and 0.28.

20. The composite material of claim 19, wherein said atomic concentration of Ge in said composite material is between 30% and 40%.

21. The composite material of claim 20, wherein said ratio of the atomic concentration of Ge to said atomic concentration of Te in said composite material is between 0.75 and 1.0.

22. The composite material of claim 21, wherein said sum of said atomic concentrations of said constituent elements of said dielectric material in said composite material is between 13% and 30%.

23. The composite material of claim 22, wherein said ratio of said atomic concentration of Ge to said atomic concentration of Te in said composite material is between 0.8 and 0.95.

24. The composite material of claim 23, wherein said sum of said atomic concentrations of said constituent elements of said dielectric material in said composite material is between 18% and 25%.

25. The composite material of claim 7, wherein said atomic concentration of Sb in said composite material is between 13% and 16%.

26. The composite material of claim 25, wherein said ratio of said atomic concentration of Sb to said atomic concentration of Ge in said composite material is between 0.43 and 0.53.

27. The composite material of claim 26, wherein said atomic concentration of Ge in said composite material is between 30% and 40%.

28. The composite material of claim 27, wherein said ratio of the atomic concentration of Ge to said atomic concentration of Te in said composite material is between 0.75 and 1.0.

29. The composite material of claim 28, wherein said sum of the atomic concentrations of said constituent elements of said dielectric material in said composite material is between 13% and 30%.

30. The composite material of claim 29, wherein said ratio of said atomic concentration of Ge to said atomic concentration of Te in said composite material is between 0.8 and 0.95.

31. The composite material of claim 30, wherein said sum of said atomic concentrations of said constituent elements of said dielectric material in said composite material is between 18% and 25%.

32. The composite material of claim 1, wherein said dielectric material comprises Si, said Si having an atomic concentration between 2% and 15% in said composite material.

33. The composite material of claim 32, wherein said atomic concentration of Sb in said composite material is between 5% and 15%.

34. The composite material of claim 33, wherein said atomic concentration of Si in said composite material is between 3% and 10%.

35. The composite material of claim 34, wherein said atomic concentration of Ge in said composite material is between 30% and 40% and said ratio of the atomic concentration of said Ge to said atomic concentration of said Te in said composite material is between 0.75 and 1.0.

36. The composite material of claim 32, wherein said atomic concentration of Sb in said composite material is between 5% and 9%.

37. The composite material of claim 36, wherein said atomic concentration of Si in said composite material is between 5% and 8%.

38. The composite material of claim 37, wherein said atomic concentration of Ge in said composite material is between 30% and 40% and said ratio of the atomic concentration of said Ge to said atomic concentration of said Te in said composite material is between 0.75 and 1.0.

39. The composite material of claim 32, wherein said atomic concentration of Sb in said composite material is between 13% and 16%.

40. The composite material of claim 39, wherein said atomic concentration of Si in said composite material is between 5% and 8%.

41. The composite material of claim 40, wherein said atomic concentration of Ge in said composite material is between 30% and 40% and said ratio of said atomic concentration of said Ge to said atomic concentration of said Te in said composite material is between 0.75 and 1.0.

* * * * *